US007017005B2

(12) United States Patent
Stark

(10) Patent No.: US 7,017,005 B2
(45) Date of Patent: *Mar. 21, 2006

(54) IMPLEMENTATION OF A CONTENT ADDRESSABLE MEMORY USING A RAM-CELL STRUCTURE

(75) Inventor: Moshe Stark, Even Yehuda (IL)

(73) Assignee: Hywire Ltd., Netanya (IL)

(*) Notice: Subject to any disclaimer, the term of this patent is extended or adjusted under 35 U.S.C. 154(b) by 321 days.

This patent is subject to a terminal disclaimer.

(21) Appl. No.: 10/229,054

(22) Filed: Aug. 28, 2002

(65) Prior Publication Data

US 2004/0049630 A1 Mar. 11, 2004

(51) Int. Cl.
*G06F 12/00* (2006.01)
(52) U.S. Cl. .................. 711/108; 707/2; 707/201; 365/49
(58) Field of Classification Search ............... 711/108; 365/49; 707/2, 201
See application file for complete search history.

(56) References Cited

U.S. PATENT DOCUMENTS

| 4,791,606 | A | | 12/1988 | Threewitt et al. |
| 4,967,341 | A | * | 10/1990 | Yamamoto et al. ............ 707/2 |
| 5,383,146 | A | | 1/1995 | Threewitt |
| 5,551,024 | A | * | 8/1996 | Waters .......................... 707/3 |
| 5,920,886 | A | * | 7/1999 | Feldmeier .................... 711/108 |
| 5,949,696 | A | | 9/1999 | Threewitt |
| 6,237,061 | B1 | * | 5/2001 | Srinivasan et al. ......... 711/108 |
| 6,389,507 | B1 | * | 5/2002 | Sherman ..................... 711/108 |
| 6,415,279 | B1 | * | 7/2002 | Gard et al. ..................... 707/2 |
| 6,438,562 | B1 | * | 8/2002 | Gupta et al. ................ 707/201 |
| 6,606,681 | B1 | * | 8/2003 | Uzun .......................... 711/108 |

* cited by examiner

*Primary Examiner*—Mano Padmanashan
*Assistant Examiner*—Mehdi Namazi
(74) *Attorney, Agent, or Firm*—Mark M. Friedman

(57) ABSTRACT

Method and device for arranging and storing data in a memory and for extracting the data from the memory in response to an input key, the method including the steps of: (a) providing at least a first array having at least two dimensions, the first array having rows and columns, the first array for storing a plurality of key entries; (b) providing at least a second array having at least two dimensions, the second array having rows and columns, the second array for storing a plurality of data entries, each of the data entries being associated with a particular one of the key entries; (c) arranging the key entries in monotonic order, and (d) identifying a single row among the rows of the first array as a sole row that may contain a particular stored key.

32 Claims, 19 Drawing Sheets

IMPLEMENTATION OF A CONTENT ADDRESSABLE MEMORY USING A RAM-CELL STRUCTURE

FIELD OF THE INVENTION

The present invention relates to the field of associative data search. More particularly, the invention relates to a method and apparatus for fast retrieval of data stored in a dense memory element containing a submitted key for data search.

BACKGROUND OF THE INVENTION

In contradistinction to widespread memory arrays, such as a Random Access Memory (RAM) that stores and retrieves data segments indexed by their address, Content Addressable Memories (CAMs) are types of Associative Memories that contain associative data (also termed "Keys") and data that is associated with these Keys (also termed "Associated Data"). A CAM stores the Keys and the Associated Data at an available location, and retrieves the data associated with a specific key by "searching" the content of that specific Key.

Typical applications utilizing CAMs are, for example, language-translation, face (e.g., of a credit card owner) or fingerprint recognition, data retrieval from a database, part inspection, etc. These types of applications can be carried out faster and more accurately using CAMs. However, currently available CAMs are small in their capacity, expensive, slow in their associated data retrieval speed, consume a substantial amount of power and are rarely used, while RAMs are large in size, inexpensive, fast and ubiquitous. Therefore, a CAM integrated circuit (chip) that is intuitive, fast, of high density and low power, and inexpensive is highly desired. In addition, intuitive and fast operation normally requires the Key being concurrently searched in all the CAM locations. Conventional CAM implementations require concurrent comparison operations performed in each memory cell. This results in a more expensive, larger, slower and high-power consuming CAM, in comparison to a RAM implemented using the same technology.

In order to reduce the CAM cost, efforts were made in several directions. For example, an effort was directed towards a solution that combines hardware and software. Software data structures, databases, neural networks, and other contrivances were sought to make RAMs operate in an associative manner. However, these solutions resulted in relatively slow search operation, because each associative reference typically requires many RAM accesses and processor cycles. Nevertheless, for many applications, the combination of a fast processor and a fast RAM has been sufficient. However, many other applications natural for CAMs, especially those which require massive amounts of memory, have not yet been developed because a sufficiently fast, dense, large and inexpensive CAM is unavailable.

Few applications, such as in data communications use CAMs since a RAM, combined with a software shell, cannot meet the speed requirements when associative lookups are required. In spite of the several improvements in the CAM density and speed, the inherent density problems, coupled with higher cost, restrict the use of CAMs to applications, such as data-packet routing and switching, where the lookup speed is the most critical factor. The conventional basic CAM cell circuit complexity remain the major obstacle for efficient CAM implementation, and therefore currently available CAMs are still expensive, have low performance and consume high power.

UTMC (USA) attempted to use a RAM technology to produce a bigger RAM-based CAM system. However, the performance of this CAM system is insufficient due to the limitations imposed by RAM components, and the limited RAM bus bandwidth.

U.S. Pat. No. 5,949,696 discloses a dynamic CAM, in which each cell contains a comparator connected to the match line output. The match line output issues a first and a second logic states in response to different and similar logic states, respectively. The CAM cell also includes a first storage element having an input connected to a first data input line, and an output connected to the comparator, a second storage element having an input connected to a second data input line, and an output connected to an input of the comparator. The cell stores masked states by storing similar logic states in both storage elements. Isolation between the match line output and the storage elements is obtained by eliminating direct connection between the match line output and the storage elements.

U.S. Pat. No. 4,791,606 discloses a dynamic CAM having N and P channel transistors aligned in stripes to provide dense packing. Each cell includes a XOR-gate for comparing a stored data bit with a comparand bit. Each pair of neighboring rows and each pair of neighboring columns is arranged symmetrically to improve the packing density.

U.S. Pat. No. 5,383,146 discloses a memory array partitioned into CAM and RAM subfields by disabling the comparator in each memory cell in selected column of CAM cells to create RAM-functioning cells. The comparators in the RAM-functioning cells can be re-enabled, so that these cells may participate in subsequent comparisons to a search word. This arrangement allows direct storage and retrieval of associated data in RAM-functioning cells that correspond to data words determined to match a given search word. However, the CAM cells disclosed in the above US patents are still relatively complex and occupy large area in comparison with RAM cells of the same technology.

All the methods described above are not a satisfactory implementation of a fast, dense, large-capacity, low-power-consuming and inexpensive CAM using RAM-based technology.

It is therefore an object of the present invention to provide a method and apparatus deploying a conventional RAM cell and structure for implementing an extremely high density, low-cost per bit, high-performance and low-power-consuming CAM.

It is another object of the present invention to provide a method and apparatus for the retrieval of data stored in an associative memory at very high speed and throughput, comparable to those of state-of-the-art RAMs.

It is still another object of the present invention to provide a method and apparatus for retrieval of data stored in an associative memory which consumes low power, comparable to state-of-the-art RAMs, deploying a reduced number of power-consuming comparison units.

It is another object of the invention to provide a high-density and low-cost-per-bit associative memory deploying a reduced number of comparison units.

It is yet another object of the invention to provide an associative memory that is cost-effective, dense, and comparable in size to a RAM implemented using the same-production technology.

It is a further object of the invention to provide an associative memory that facilitates the insertion and/or the deletion of Keys and their Associated Data at a speed that meets the application requirements.

Other objects and advantages of the invention will become apparent as the description proceeds.

SUMMARY OF THE INVENTION

The present invention is a directed to a method for arranging, storing and extracting data at a high rate from a two-dimensional memory array of Keys. The two-dimensional array (TDA), which consists of key-data memory cells (Key-List TDA), is arranged in rows and columns, each of the keys having a unique index pair that indicate the key location in the array, and Associated Data stored under the same pair of indices in another two-dimensional memory array (Associated-Data TDA). Upon request, an input key is searched in the Key-List TDA for a key that is identical to the input key, and if found, the associated data is retrieved from the corresponding cell in the Associated-Data TDA. A match signal, "True" or "False" in value, is issued simultaneously with the retrieved associated data, and indicates whether the associated data is valid or not. The keys in the array are arranged, each key in a separate cell, in rows, in a subsequent ascending or descending order. Each new row starts from the same edge column in the array, so that at least a portion of the array is filled without blanks with valid keys. The key list is arranged and stored in the array prior to a key search.

Upon receiving a request for searching an input key, the row, which may potentially contain the searched key that is identical to the input key, is located and selected. If no such row is found, a no-match signal is output. If such a row is located, the input key is searched in that row. If the searched key is stored in the selected row, its location is identified. The data associated with the searched key that is stored in the corresponding cell (under the same index-pair of the searched key) of the Associated-Data TDA and the corresponding match signal are concurrently output. If the input key is not located, a "False" signal indicating a no-match is output.

The array may be transposed, so that the rows become columns and the columns become rows.

Preferably, if the row that may contain a stored key that is identical to the input key is arranged in an ascending order, then that row is selected by performing the following steps:

a) comparing the input key with each key stored in the edge column, which contains the lowest value stored in each row;

b) identifying the row for which an equality is firstly obtained, and selecting that row; and c) if no equality is obtained in step (b) above, identifying the row for which a "greater-than" result first changes to a "smaller-than" result, and selecting the preceding row.

Alternatively, a column containing the highest values of each row in the TDA with keys arranged in ascending order may be used to identify the row in which the input key can be potentially located.

Preferably, if the row that may contain a stored key identical to the input key is arranged in a descending order, then that row is selected by performing the following steps:

a) comparing the input key with each key stored in the edge column, which contains the highest value of each row;

b) identifying the row for which an equality is first obtained, and selecting that row; and c) if no equality is obtained in step (b) above, identifying the row for which a "smaller-than" result first changes to a "greater-than" result, and selecting the preceding row.

Alternatively, any other column in the TDA may be used to identify the row in which the input key is potentially located, since the stored two-dimensional keys are always ordered in a descending order. This is also valid for the other edge column, which contains the lowest key values in each row.

Preferably, prior to comparing the input key with the set of the lowest keys in each row, these keys are copied into a set of memory cells external to the TDA. These memory cells are concurrently accessible (unlike the lowest key cells of the TDA), thereby enabling immediate and concurrent access to their content.

Alternatively, when the highest key values are used to identify the row in which the input key may be potentially located, then, prior to comparing the input key with the set of the highest keys in each row, these keys are preferably copied into a set of memory cells external to the TDA. These memory cells are also concurrently accessible (unlike the highest key cells of the TDA) to enable immediate and concurrent access to their content.

According to a preferred embodiment of the invention, the column that contains a stored key identical to the input key (if such an identity actually exists) is identified using the following steps:

a) comparing the input key with each key stored in the located row; and b) seeking the cell for which an equality is obtained, and, if such a cell is found, locating the column that contains the cell.

The time required for seeking an input key within the stored key list may be reduced by concurrently seeking the current input key (within the keys of the recently located row), while locating the row for the subsequently searched input key.

Preferably, an enlist operation for inserting and storing a new key into the TDA, while maintaining the ascending or descending key order, is performed by the following steps:

a) identifying the row in which the new key should be inserted and selecting that row;

b) identifying the column in the selected row, after which, or before which, the new key should be inserted and selecting that column, thereby obtaining the indices of the insertion location;

c) if the keys in that row are arranged in an ascending order, shifting by one position towards the subsequent location the content of each cell which contains a key greater than the input key, thereby filling without blanks that portion of the array, which contains valid keys; and d) if the keys in that row are arranged in a descending order, shifting by one position towards the preceding location the content of each cell which contains a key smaller than the input key, thereby filling without blanks that portion of the array which contains valid keys.

Preferably, a remove operation for removing a key from the array while preserving the keys ascending or descending order, is performed by the following steps:

a) identifying the row from which the key should be removed and selecting that row;

b) identifying the column in the located row, from which the key should be removed and selecting that column, thereby acquiring the index of that column;

c) if the keys are arranged in an ascending order, shifting by one position towards the preceding location the content of each cell which contains a key greater than the input key, thereby filling without blanks that portion of the array with the keys, and overwriting the content of the cell that contains the key to be removed; and d) if the row is arranged in an descending order, shifting by one position towards the subsequent location the content of each cell which contains a key smaller than the input key, thereby filling without blanks that portion of the array with valid keys.

According to a preferred embodiment of the invention, the data associated with each key is prearranged respectively to the key-data in another TDA of memory cells consisting of rows and columns, such that each memory cell contains the data associated with the key located under the same index pair.

Alternatively, the TDAs of memory cells for the key list and the associated data may be merged into a single TDA, each memory cell in the unified array containing a key portion and a respective associated-data portion.

According to yet another aspect of the present invention there is provided a method for arranging and storing data in a memory and for extracting the data from the memory in response to an input key, the method including the steps of: (a) providing at least a first array having at least two dimensions, the first array having rows and columns, the first array for storing a plurality of key entries; (b) providing at least a second array having at least two dimensions, the second array having rows and columns, the second array for storing a plurality of data entries, each of the data entries being associated with a particular one of the key entries; (c) arranging the key entries in monotonic order, and (d) identifying a single row among the rows of the first array as a sole row that may contain a particular stored key.

According to further features in the described preferred embodiments, the identifying is performed in a single processing step.

According to still further features in the described preferred embodiments, the method further includes the step of: (e) identifying a single cell within the single row as a sole cell that may contain a particular stored key entry of the key entries.

According to still further features in the described preferred embodiments, the method further includes the step of: (f) if the particular stored key entry is identical to an input key, retrieving a particular one of the data entries associated with the particular stored key entry.

According to still further features in the described preferred embodiments, the method further includes a Removal step of: (f) removing the particular stored key entry, and removing a particular one of the data entries associated with the particular stored key entry.

According to still further features in the described preferred embodiments, the method further includes the step of: (e) identifying a single cell within the single row as a sole cell for enlisting a particular key entry.

According to still further features in the described preferred embodiments, each of the data entries has a unique pair of row and column indices for association with a unique pair of row and column indices of a particular one of the key entries.

According to still further features in the described preferred embodiments, the first array is completely filled with the key entries.

According to still further features in the described preferred embodiments, the method further includes the step of: (f) if the particular stored key entry is identical to an input key, producing a match signal.

According to still further features in the described preferred embodiments, the method further includes the step of: (f) if the particular stored key entry is different from an input key, producing a no-match signal.

According to still further features in the described preferred embodiments, the identifying of a single row is performed using at least one comparator for each row of the rows of the first array.

According to still further features in the described preferred embodiments, the method further includes the step of: (e) storing an end key entry from each row of the first array in a Column Register.

According to still further features in the described preferred embodiments, the identifying of the single row is performed by: (i) comparing each end key entry and an input key to produce a result, and (ii) identifying a row in which the result undergoes a change in inequality status.

According to still further features in the described preferred embodiments, the method further includes the step of: (f) selecting the row.

According to still further features in the described preferred embodiments, a rate of key lookups of the key entries is increased by concurrently: (i) identifying a location of an input key in a row in the first array that has been previously identified and selected, and (ii) identifying and selecting a row that may contain a subsequently submitted input key.

According to still further features in the described preferred embodiments, the identifying in step (d) includes comparing a new key entry with a key entry disposed in an end column of the first array.

According to still further features in the described preferred embodiments, the method further includes the step of: (e) checking, prior to enlisting, that the new key entry is not already enlisted in the first array.

According to still further features in the described preferred embodiments, the monotonic order is maintained by shifting a content of each cell disposed after an insertion location respectively, by one position.

According to still further features in the described preferred embodiments, the identifying of the single cell is performed using at least one comparator for each column of the columns of the first array.

According to yet another aspect of the present invention there is provided a device for storing arranged data in a memory, and for extracting the data therefrom, the device including: (a) a random access memory including: (i) a first array of cells, the first array having at least two dimensions and consisting of rows and columns, the first array containing a plurality of key entries, each of the cells having a unique address and being accessible via an input key; (ii) a second array of cells, the second array having at least two dimensions and consisting of rows and columns, the second array having a plurality of associated data entries; wherein the memory is designed and configured such that each of the data entries is associated with a particular one of the key entries, and (b) processing means for (i) arranging the key entries in monotonic order, and (ii) identifying a single row among the rows of the first array as a sole row for performing a processing operation.

According to further features in the described preferred embodiments, each of the associated data entries has a unique pair of row and column indices for association with a unique pair of row and column indices of a particular one of the key entries.

According to still further features in the described preferred embodiments, the processing means include: (i) a row locator containing at least a first comparator, for comparing contents of an end column of the first array with an input key and for identifying a row that is a sole row that may contain a particular key entry that is identical to the input key.

According to still further features in the described preferred embodiments, the processing means further include: (ii) a column locator containing at least a second comparator, for comparing contents of the row with the input key to identify a single cell within the sole row as a sole cell that may contain a particular stored key entry of the key entries containing the particular key entry that is identical to the input key.

According to still further features in the described preferred embodiments, the processing means further include: (ii) a column register for allowing a simultaneous access to the key entries disposed in the end column of the first array.

According to still further features in the described preferred embodiments, the row locator includes at least one comparator for each row containing the key entries.

According to still further features in the described preferred embodiments, the column locator includes at least one comparator for each column containing the key entries.

According to still further features in the described preferred embodiments, the processing means include: (i) an inserter/remover for rearranging data stored in the arrays.

According to still further features in the described preferred embodiments, the inserter/remover includes shift registers.

According to still further features in the described preferred embodiments, the inserter/remover includes a number of shift registers, the number exceeding, by one, the number of columns in the first array.

According to still further features in the described preferred embodiments, the processing operation includes an Insert operation.

According to still further features in the described preferred embodiments, the processing operation includes a Remove operation.

According to still further features in the described preferred embodiments, the processing operation includes retrieving an associated data entry of the plurality of associated data entries, the data entry being associated with the particular stored key entry.

The two-dimensional memory arrays can be implemented using a RAM architecture. Preferably, this apparatus can be implemented using a volatile SRAM, DRAM, or CCD technology. Alternatively, for certain applications, this apparatus can be implemented with nonvolatile technologies, such as ROM, EPROM, $E^2$PROM, Flash memory or magnetic media.

The external column (or row) memory or the row memory in the apparatus may be implemented with a shift register, which can shift data in both directions. Alternatively, the column (or row) memory may be implemented using a random access memory.

Preferably, the apparatus further includes:
a) a row (or column) locator containing a first array of one or more comparators, linked to the first column (or row) memory, for comparing the content of a selected column (or row) from the TDA with an input key and for identifying the row which may potentially contain the searched key, identical to the input key, according to the comparison results; and
b) a column (or row) locator containing a second array of one or more comparators, linked to the second row (or column) memory, for comparing the content of a selected row (or column) in the TDA with the input key to locate the stored key that is identical to the input key.

According to a preferred embodiment of the invention, the apparatus further includes an inserter/remover, linked to the second row (or column) memory and to the column (or row) locator, for rearranging data stored in the second row (or column) memory and in the TDA.

Preferably, the inserter/remover includes:
a) a set of controllable switches, linked to the second row (or column) memory and to the column locator, for shifting data stored in the second row (or column) memory to the left or right, for shifting data (to the left or right) between adjacent cells, for deleting data from one or more cell and/or for inserting data into one or more cells; and
b) a controller for controlling the operations of the set of controllable switches and for controlling the data transfer from the TDA rows (or columns) to the second row (or column) memory and vice versa.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein:

FIG. 2 schematically illustrates the arrangement of keys in a two-dimensional M-column by N-row memory array;

Figure 5:
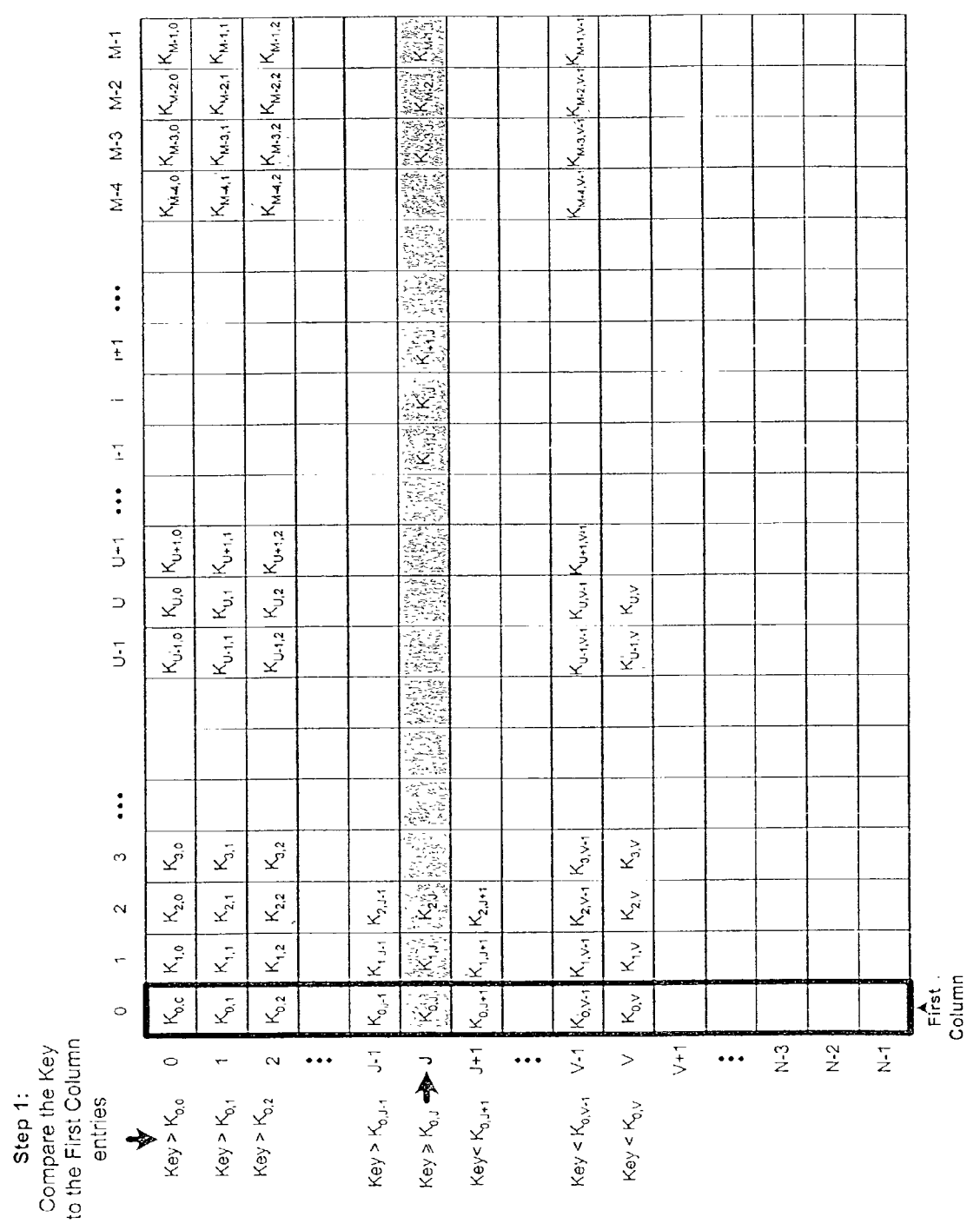
Figure 6:
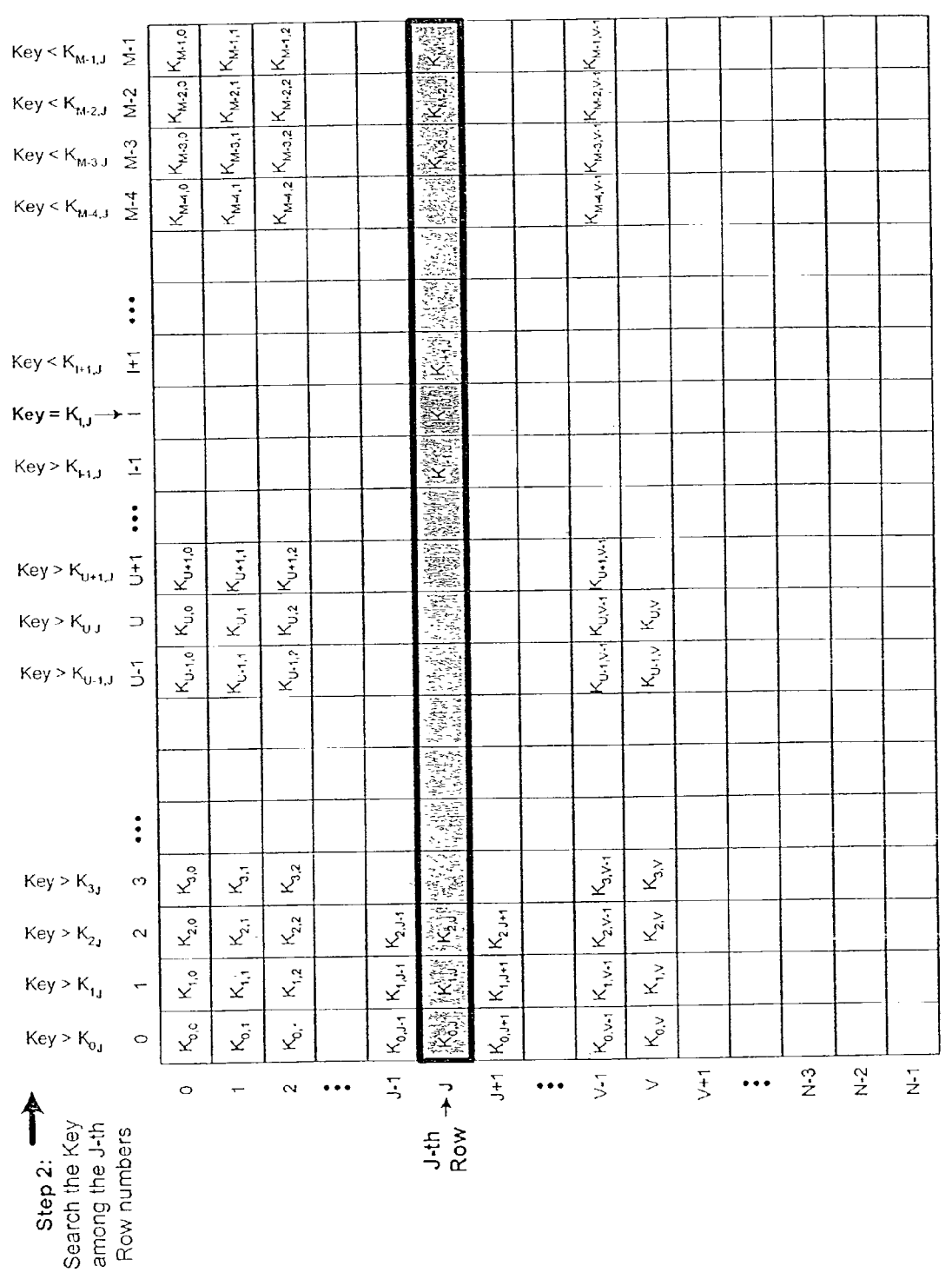

FIG. 5 and FIG. 6 schematically illustrate a two-step, sequential Key Search in a TDA;

DETAILED DESCRIPTION OF PREFERRED EMBODIMENTS

Figure 1:
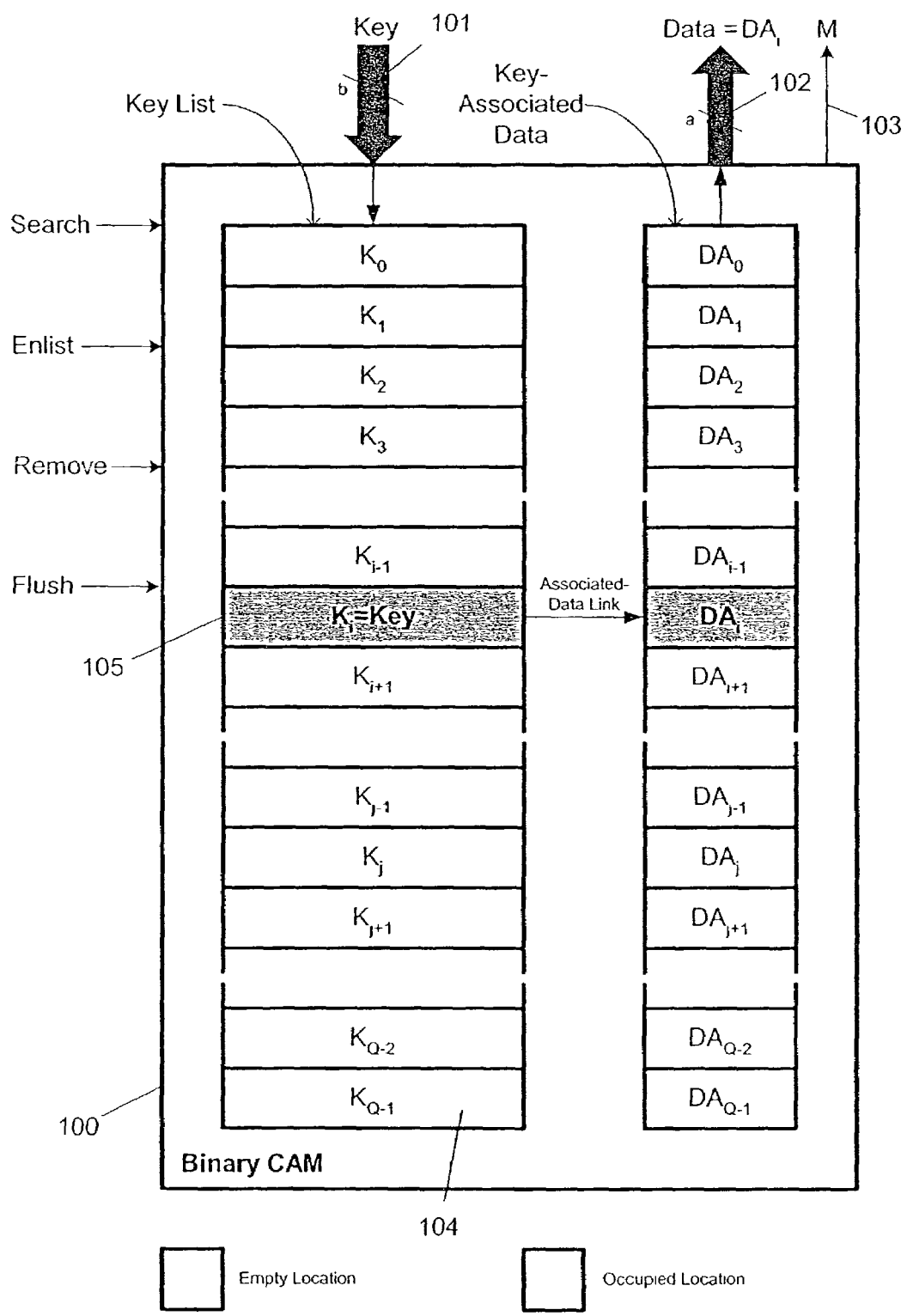
FIG. 1 schematically illustrates a functional block diagram of a RAM-Based Binary CAM, which includes a Key-Storage RAM and its Associated-Data RAM.

In general, a Binary CAM is a CAM that searches an input key in a Key list, precisely matches the input key to a Key entry of equal value, and issues datum associated with this Key entry. FIG. 1 schematically illustrates a functional block diagram of a Binary CAM (a CAM that stores keys, wherein each key is represented by a sequence of bits that assume "1" or "0" logic values). The Binary CAM 100 incorporates Q associative b-bit Keys, $K_0, K_1, K_2, \ldots, K_{Q-2}, K_{Q-1}$, and Q a-bit Key-Associated-Data entries, $DA_0, DA_1, DA_2, \ldots, DA_{Q-2}, DA_{Q-1}$, wherein $DA_1$ is the data associated with $K_1$ ($0 \leq i < Q$).

Key Search and Key-Associated-Data Retrieval is the primary operation performed by a CAM. The Key is a b-bit data entity submitted to the CAM via a b-bit-wide bus 101. When a Search command is issued, the CAM searches a specific Key in the Key list. If the Key matches the input key, the a-bit data associated with that specific Key is output on the associated Data bus 102. Concurrently a "True" Match signal is issued on the M line 103. If the Key is not listed in the Key List, a "False" No-Match signal is issued on the M line to indicate that a matching Key has not been found and the output associated data is irrelevant.

The type of association between the Keys and the Associative Data defines also the type of the CAM 100. The Binary CAM's association is the simplest. A match is obtained whenever the searched input Key and the enlisted Key entry match precisely.

M="True" if there is a $K_1$ for which $K_1$=Key, wherein i is an integer and $0 \leq i \leq Q-1$ for all valid entries. Otherwise, M="False".

Since it is neither a necessary requirement that all the CAM entries be occupied, nor that the valid entries be continuous, the valid entries should be validated. Similarly, the empty entries must be invalidated. For instance, a "Valid" bit associated with the Key entry may validate this entry. If the associated bit is "True", then the entry is valid, otherwise the entry is invalid or not occupied. The list of "Valid" locations may be internal or external to the CAM 100.

The CAM should be capable of "skipping over" the empty-invalid entries and accounting only for the occupied-valid entries.

Provided that M="True", there is an entry $K_1$=Key and Data=$DA_1$. The empty-invalid entries shown in FIG. 1 are left blank. The light shadowing of Key-List block 104 indicates locations occupied with valid data, and the dark shadowing of the cell 105 indicates the location of the entry that matches the searched Key. According to a preferred embodiment of the invention, the CAM operates properly by setting its initial list, enlisting of new entries, and removing the obsolete entries.

The Flush signal invalidates all the CAM locations. This can be carried out setting a "Valid" bit associated with the CAM Key List to "False".

The Enlist control input allows the addition of a new Key to the Key List and a new associated data to the Associated-Data List. This operation is carried out entering the Key along with the associated data to the CAM and concurrently issuing an Enlist command. The Key may be entered via the Key bus and the data via the Data bus. In this case, the Data-bus direction is reversed and serves to input the associated data during Enlist operation.

Enlisting a new entry in a specific location can be performed autonomously by the CAM, or under the control of an external processor (or using other combinations). This depends on the level of support of the CAM for such operations. For instance, the CAM may intelligently manage the "free-location lookup". Alternatively, the allocation of free-location entries can be managed by an external processor.

The Remove signal allows the removal of "aged" and/or obsolete entries. This command is important because it dynamically frees the precious Key List space necessary to Enlist "newly generated" Keys.

Also, each Key entry is unique, because two identical Keys associated with same data is a waste of keys, and having two identical Keys with different associated data leads to a logical contradiction; i.e., $K_i \neq K_j$ for any $i \neq j$ According to a preferred embodiment of the invention, the Binary CAM 100 performs the Search operation in a single step, without the need for applying a multiple-step procedure. Multiple-step implementations may involve a simple memory, and a processor, which executes this procedure. For some applications, such as data communications, searches must be performed at wire-speed (i.e., at the input data rate) and therefore, having a multiple-step procedure would not meet the speed performance requirements. A single-step Search operation normally requires a CAM, which performs search operations at the same rate as that of the incoming data, provided that their clock frequency is sufficiently high. Conventional types of such CAMs usually require a comparator per each Key entry, which slows down the CAM search rate, resulting in a larger CAM die-size than that of a conventional RAM, and in a high-power consumption for the same number of stored bits and using the same process technology.

According to a preferred embodiment of the invention, the Key List is prearranged in an ascending or descending order in the two-dimensional memory array. The empty locations in the memory array are contiguous, and may follow or precede the Key-occupied locations, with a uniquely defined transition point between the last occupied location and the first empty location, or vice versa. The block of occupied locations block, may either start at the first memory address, or end in the last memory array address.

Although the RAM-based CAM might be implemented using any of the forms described hereinabove, for the sake of brevity, the description hereinbelow is based upon the following assumptions:

The Key Entries are stored in a contiguous ascending order;

The Key List starts at the lowest memory array address;

The block of empty locations block follows the Key List.

Figure 2:
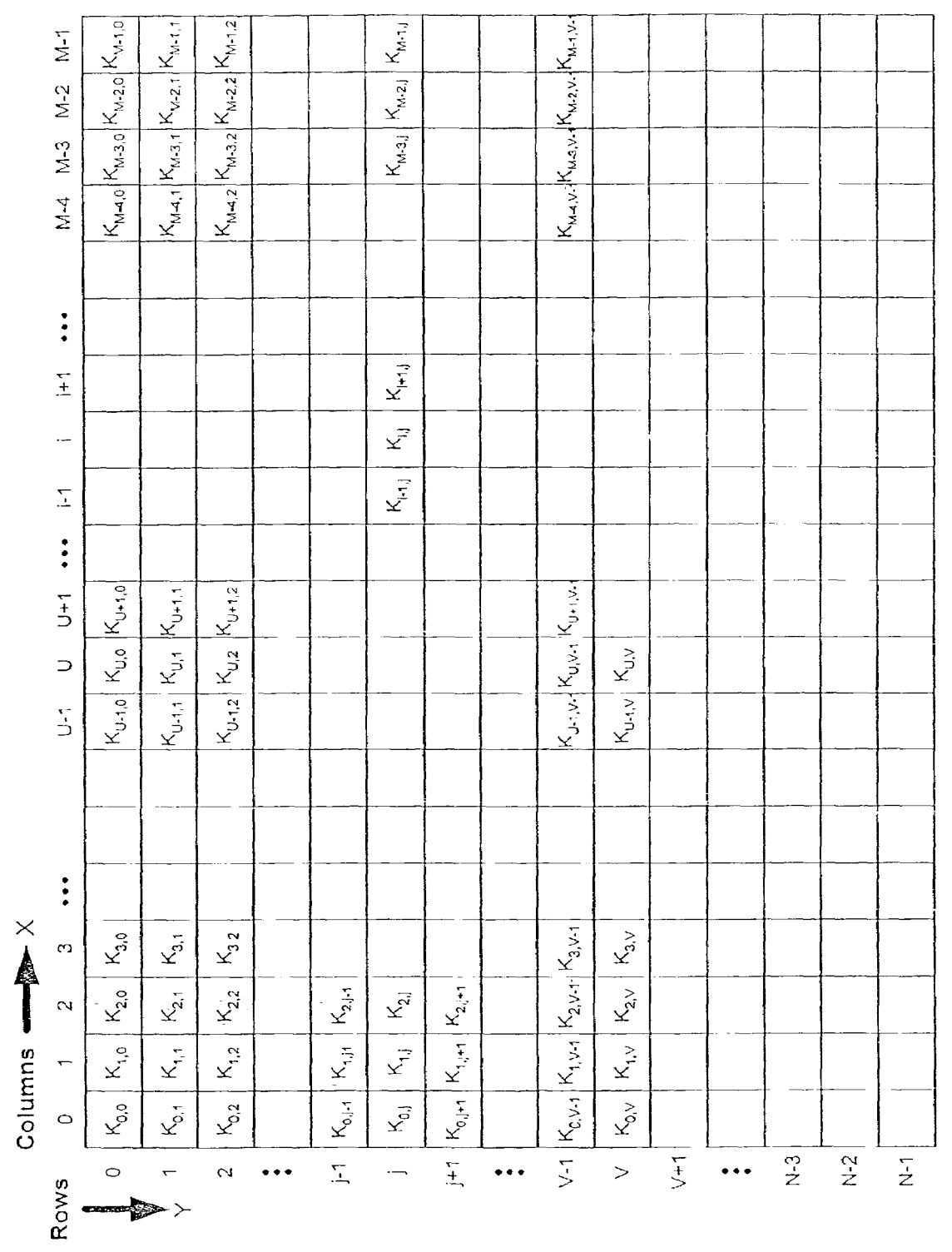

FIG. 2 schematically illustrates the Key List arranged in a two-dimensional array (TDA) of M columns and N rows, according to a preferred embodiment of the invention. The rows are sequenced from top to bottom and indexed with an index j, where $0 \leq j \leq N-1$. The columns are sequenced from left to right and indexed with an index i, where $0 \leq i \leq M-1$. The occupied Key entries locations are shadowed. The empty locations are blank. A Key $K_{i,j}$ located in column i and row j is a b-bit integer. The lowest Key value $K_{0,0}$ resides in row 0 and column 0. The highest Key value $K_{U,V}$ resides in row V and column U.

Thus, $$K_{p,r} > K_{q,r} \rightarrow p > q, \text{ and either } r \leq V, \text{ and } p \leq M-1, \text{ or } r = V, \text{ and } p \leq U \quad (3)$$

$$K_{p,s} > K_{p,r} \rightarrow s > r, \text{ for } s < V, \text{ and } p \leq M-1, \text{ or } s = V, \text{ and } p \leq U \quad (4)$$

Figure 3:
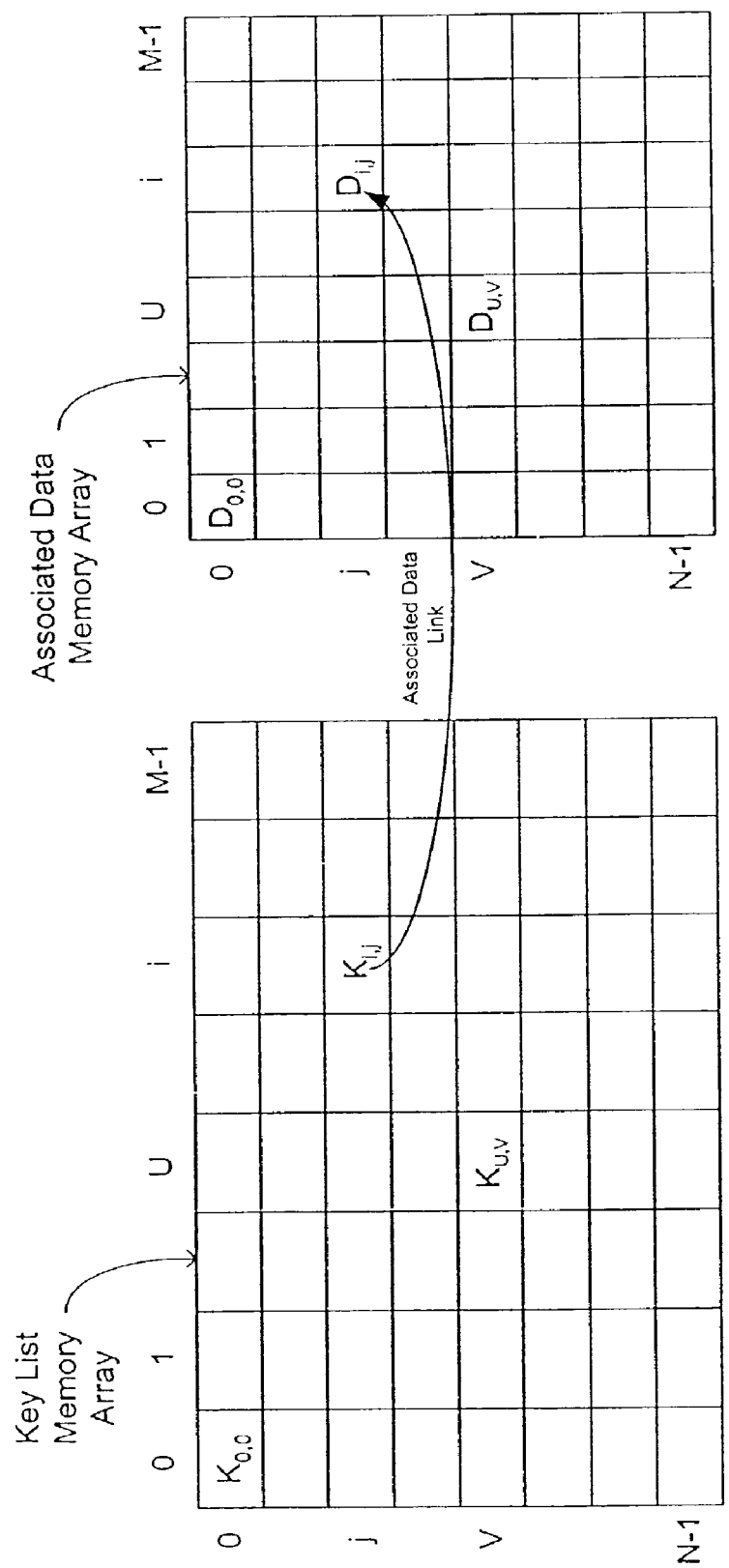
FIG. 3 schematically illustrates the relationship between the Key-List TDA and the Associated-Data TDA.

FIG. 3 illustrates the relationship between the Key List and the associated data, according to a preferred embodiment of the invention. The Associated Data is also arranged in a corresponding TDA of N rows by M columns. The associated data $DA_{i,j}$, which resides in row j and column i of the Associated-Data TDA, corresponds to Key $K_{i,j}$, residing in the same row and column of in the Key-List TDA. This arrangement allows a straightforward access to $DA_{i,j}$ once $K_{i,j}$ is searched and located. The Key List and the Associated Data list may be physically separated or merged into the same TDA. In this example, each of the lists forms a separate TDA. Since the Associated-Data memory array is addressed by its row and column indices, it can be implemented using a conventional SRAM, or a DRAM memory.

Figure 4:
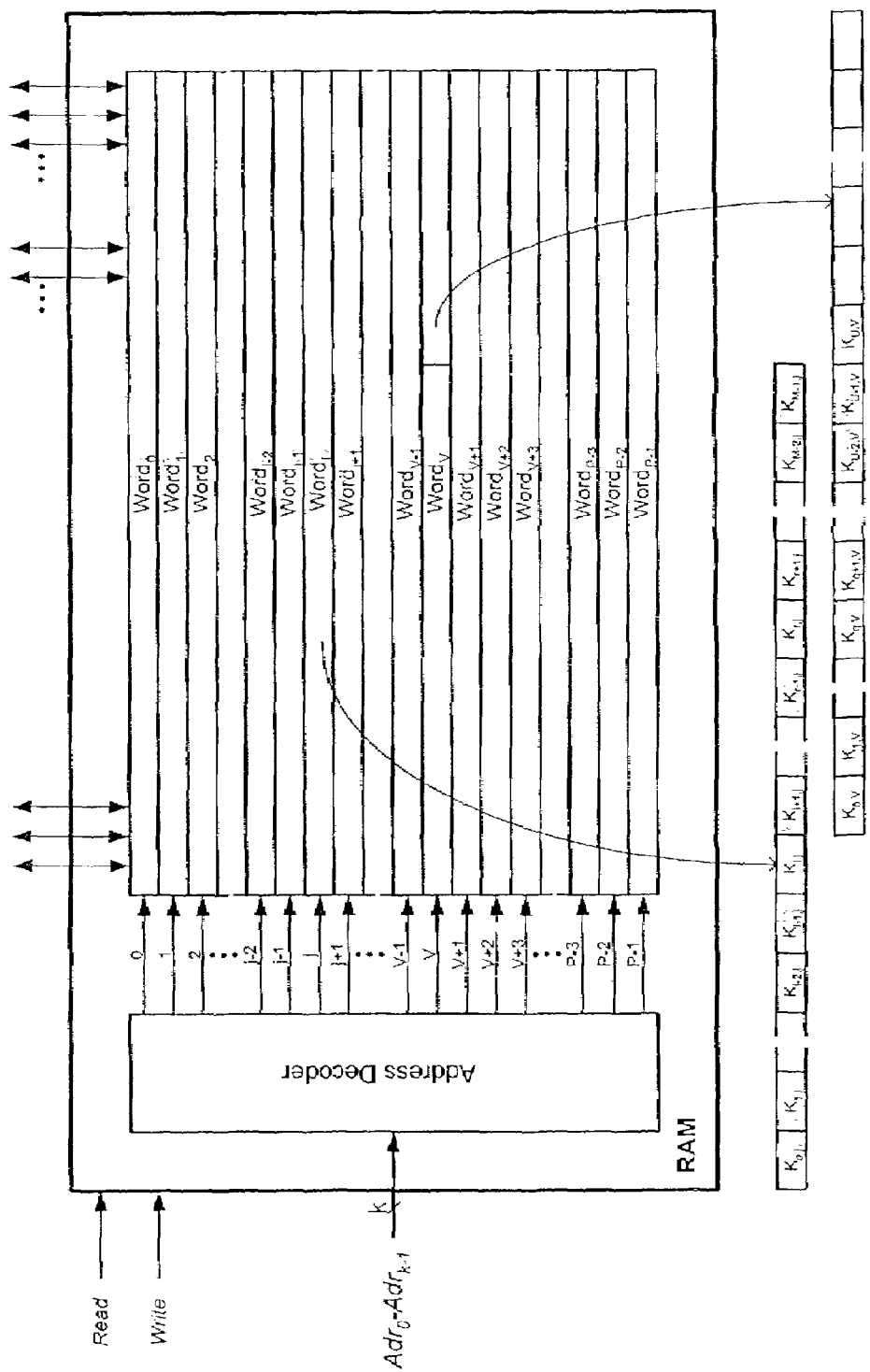
FIG. 4 schematically illustrates the mapping of Keys into a conventional RAM structure.

FIG. 4 illustrates the implementation of the Key-List TDA using a conventional RAM and the relationship between the parameters of the TDA and of the RAM.

The TDA parameters are:
b—Key data width;
M—Number of columns or number of b-bit Key words in a TDA row;
N—Number of TDA rows;
U—Last Key Entry column;
V—Last Key entry row;
j—Row index of Key $K_{i,j}$, where $0 \leq j \leq V$; and
i—Column index of Key $K_{i,j}$, where $0 \leq i \leq M-1$ for j<V and $0 \leq i \leq V$ for j=V.

According to a preferred embodiment of the invention, the RAM used is a conventional RAM characterized by the following parameters:
w—RAM word width and width of the RAM data bus;
$\delta_0$ to $\delta_{w-1}$—w-bit RAM word bus, where $\delta_0$ is defined as the word rightmost bit, and $\delta_{w-1}$ is the word leftmost bit;
P—Number of w-wide words in the RAM; and
$Adr_0$ to $Adr_{k-1}$—k-bit RAM address bus.

Each w-wide RAM word contains M Key-words; therefore, $$w = M \cdot b \quad (5)$$

The RAM contains all the Key entries; therefore, $$P \cdot M \leq U \cdot V \quad (6)$$

The RAM address bus width must fulfill the following conditions:

$$P \leq 2^k < 2 \cdot P \quad (7)$$

The location of a key $K_{i,j}$ in the TDA is defined as follows: Define, $$(Adr_{k-1}, Adr_{k-2}, \ldots, Adr_2, Adr_1, Adr_0)_2 = j, \text{ where}$$
$$(Adr_{k-1}, Adr_{k-2}, \ldots, Adr_2, Adr_1, Adr_0)_2 \text{ is the binary representation of the address value on the RAM Address Bus.} \quad (8)$$

$$Ki,j = (\kappa_{b-1}, \kappa_{b-2}, \kappa_{b-3}, \ldots, \kappa_2, \kappa_1, \kappa_0)_2, \quad (9)$$

where $(\kappa_{b-1}, \kappa_{b-2}, \kappa_{b-3}, \ldots, \kappa_2, \kappa_1, \kappa_0)_2$ is the binary representation of the Key located in (i,j), the bit $\kappa_s$ in the Key's binary representation is equal to the bit $\delta_t$ in RAM word:

$$\kappa_s = \delta_t \text{ where,} \quad (10)$$

$t = w - (i+1) \cdot b + s$, and s, t are integers, $0 \leq s \leq b-1$,
$0 \leq t \leq w-1$ (11)

The mapping given by Eq. 11 allows the implementation of a TDA using a conventional RAM. The constraints related to the RAM bus width of given by Eq. (5). A single RAM word may incorporate M Keys, all accessible in a single RAM read or write operation.

The TDA can be implemented with any type of RAM, such as a static RAM (SRAM), a dynamic RAM, (DRAM), or any other memory technology that facilitates random access to data.

The arrangement described by Eq. (11) corresponds to the preferred embodiment depicted in FIG. 2 above. Of course, other TDA mappings into the RAM structure are possible.

Key Search Procedure in a Key-List TDA

Sequential Two-Step Search:

FIG. 5 and FIG. 6 schematically illustrate a two-step, Key Search sequence in a TDA, according to a preferred embodiment of the invention. The first step (Step 1) is shown in FIG. 5 and describes the location of row in the TDA, where the searched Key may be potentially located. The second step (Step 2) is shown in FIG. 6 and includes accessing the row identified in Step 1 and seeking the Key in that row (Key "look-up").

Prior to Key Search in the Key List, the Key is compared with the Key List values in the first and last locations. If Key<$K_{0,0}$ or Key>$K_{U,V}$, the search is terminated, since the Key is not included in the Key List.

If, $K_{0,0} \leq$ Key $\leq K_{U,V}$, the Key is potentially enlisted in the Key List and further Search steps are carried out, starting with Step 1.

Step 1: In this step, a TDA row in which the Key may potentially reside is located. This row is identified searching in the First Column Keys. The Key List elements appear in an ascending order. Therefore, the First Column Keys also appear in an ascending order. Therefore, $$K_{0,0} < K_{0,1} < K_{0,2} < \ldots < K_{0,j-1} < K_{0,j} < K_{0,j+1} < \ldots < K_{0,V-1} < K_{0,V} \quad (12)$$

If the Key is listed in the Key List, it should be located in between two First Column Keys, one smaller or equal and the other greater than the searched Key. Therefore, there is a J such that, $$K_{0,J} \leq \text{Key} < K_{0,J+1} \text{ for } J<V \text{ or } K_{0,V} \leq \text{Key} \leq K_{U,V} \text{ for } J=V \quad (13)$$

FIG. 5 shows that if the keys are arranged in an ascending order, the searched Key is greater than all the First Column elements preceding the target row (J-th row), equal or greater than the First Column Key in the target row, and smaller than all the First Column Keys succeeding the target row. Therefore, the target row is located by comparing the searched Key with each First-Column Keys.

Step 2: In this step, a TDA column is searched in the located target row, where the searched Key potentially resides, as shown in FIG. 6. The entire J-th row is read out and all the Keys enlisted in the row are compared with the searched Key. If a column index I is found such that, $$K_{I,J} = \text{Key}, \quad (14)$$

then the Key enlisted in row J, and the value located in column I matches the searched Key. In this case, the pair of indices (I,J) is used to access the Associated Data which corresponds to the searched Key and is located in the Associated Data Memory Array under the same index. The Associated Data $DA_{I,J}$ is readout from the TDA along with a "True" Match signal value at the output M (i.e., M="True" in FIG. 1 above) to indicate the validity of the Associated Data.

If

Key$\neq K_{i,j}$ for $0 \leq i \leq M-1$ for $J \neq V$ or if Key$\neq K_{i,j}$ for
$0 \leq i \leq V$ if $J = V$, (15)

then there is no match (i.e., the searched Key is not enlisted). In this case, the CAM issues an M="False" signal to indicate no-match and the invalidity of the Associated Data issued on the Associated-Data Bus. When M="False", the data output is irrelevant and can be arbitrarily and randomly set. In some cases, it is preferable to force a predetermined/programmable value in the data bus.

Figure 7:
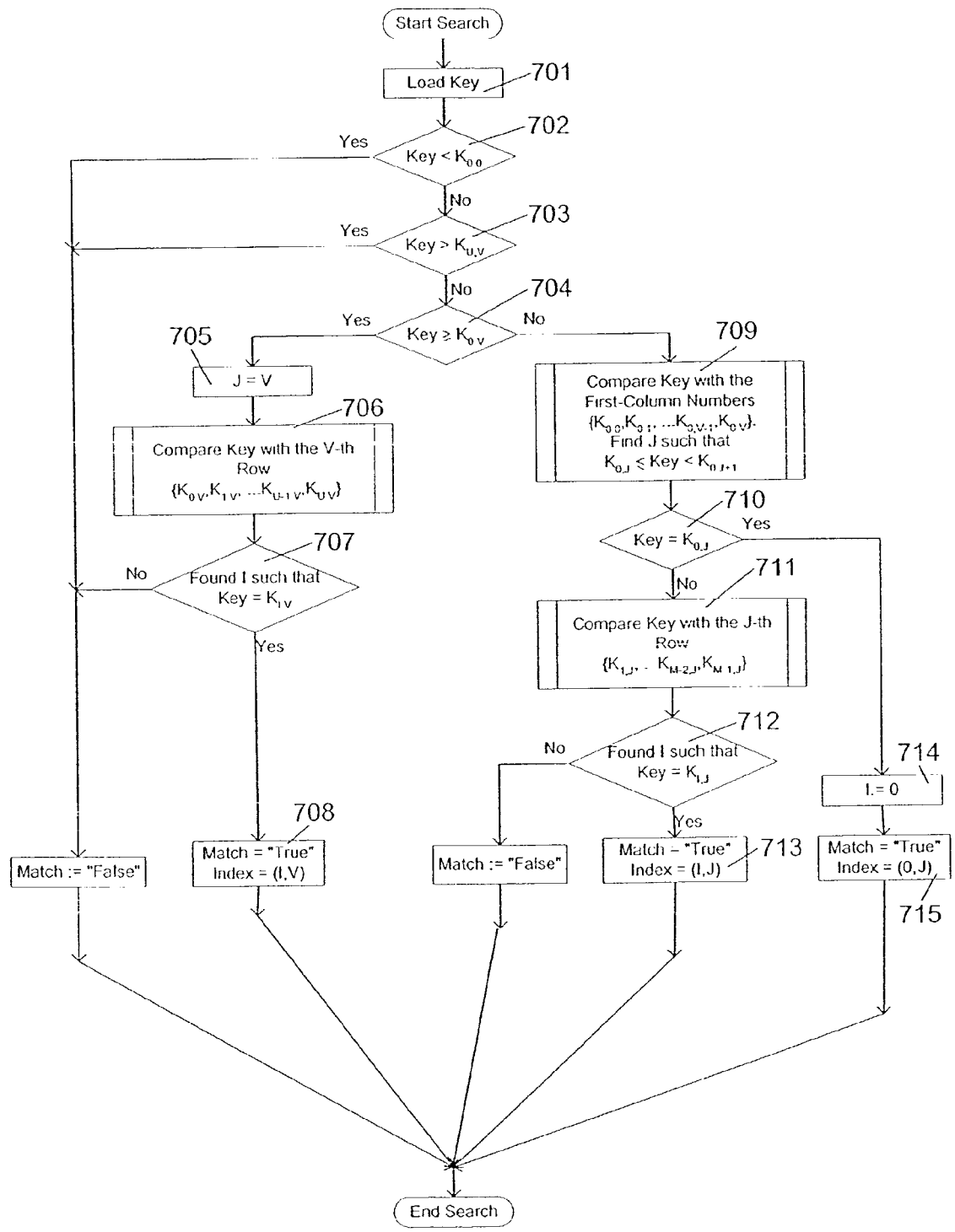
FIG. 7 shows a flowchart of a two-step Key search.

FIG. 7 shows a flowchart of a two-step Key search, according to a preferred embodiment of the invention. In the first step 701, the searched Key is loaded. In the next step 702, the searched Key is compared with the lowest Key $K_{0,0}$. If Key<$K_{0,0}$, then the search is terminated with no match. If Key≦$K_{0,0}$, the searched Key is compared with the highest Key $K_{U,V}$ in step 703. If Key>$K_{U,V}$, then the search is terminated with no match. If Key≦$K_{U,V}$, in step 704, then the searched Key is compared with the highest Key in the first column, $K_{0,V}$. If Key≦$K_{0,V}$, then the target row is identified as row V in step 705. Then, the searched Key is compared with each Key enlisted in row V in step 706, and, if a match is not found in step 707, then the search is terminated with no match. If a match is found in column I, the search is completed in the next step 708 with a match, and the matching indices (I,V) are output.

If, in step 704, Key<$K_{0,V}$, then in step 709, the searched Key is compared with the Keys of the first column and a row J is found so that $K_{0,J}$≦Key<$K_{0,J+1}$. In the next step 710, the searched Key is compared with the first enlisted Key in row J–$K_{0,J}$. If Key≠$K_{0,J}$, then the searched Key is compared with each Key enlisted in the J-th row in step 711. In step 712, a column index I is sought so that Key=$K_{I,J}$. If found, the search is terminated in the next step 713 with a match and the matching location indices (I,J) are output. If not, the search is terminated with no match. If, in step 710, Key=$K_{0,J}$, the target column index 0 is identified in step 714. The search is then completed in step 715 with a match and the matching indices (0,J) are output.

Pipelined Two-Step Search:

The Search operation described herein above is executed in two steps. Thus, the next Search can only start after the completion of Step 2 of the recent Search.

A conventional, high-density/high-performance RAM (an SRAM or a DRAM), requires, prior to each readout, a column pre-charge. In most practical cases, the RAM is clocked by a clock signal of period T. Thus, the two-step search operation requires two clock cycles for execution. If the clock frequency is $f_c$, then the Search throughput $f_s^{2S}$ for a two-step search is given by:

$$f_s^{2S} = \frac{f_c}{2} = \frac{1}{2 \cdot T} \qquad (16)$$

which means that the Two-Step Search described hereinabove is performed at half the RAM clock rate.

According to a preferred embodiment of the invention, a slight modification in the Two-Step Search enables to perform Search operations at the full clock rate, $f_c$. This is accomplished using a "pipelined search".

Assuming that Step 1 (row search) is performed on the subsequent Key concurrently with fetching a RAM word, and Step 2 (column search) is performed on the current Key, then Step 1 and Step 2 of the Search operation are pipelined. Step 1 for Key m+1 in the sequence is performed concurrently with Step 2 for the m-th Key.

Figure 8:
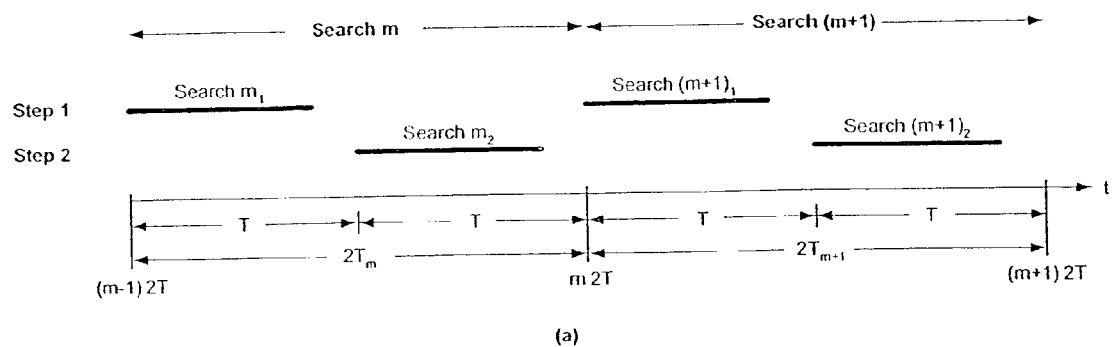
FIG. 8a and FIG. 8b illustrate the timing diagrams for a sequential two-step and pipelined search methods, respectively.
Figure 8:
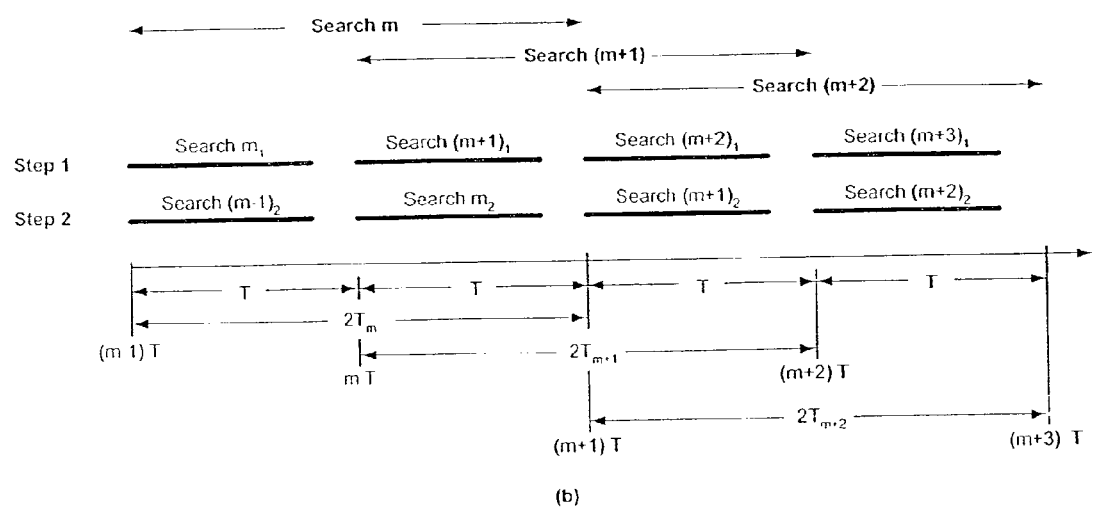

FIG. 8a and FIG. 8b illustrate the difference in between the two-step and pipelined Search procedures, according to a preferred embodiment of the invention. In both procedures, it is assumed that:

Each step of the two-step search cycle requires one RAM clock period T for execution. Thus, each search cycle lasts 2T.

The Search operation starts with a search cycle for submitted Key 1, denoted as Search 1, which starts with a at t=0. Thus, step 1 of Search 1 (RAM row identification) is completed at t=T and step 2 (key entry location in the identified row) at t=2T.

Search $m_1$ and Search $m_2$ represent steps 1 and 2, respectively, of a generic Search m for submitted Key m.

FIG. 8a demonstrates that the time required to carry out a two-step procedure for two subsequent search operations require four clock cycles—two clock cycles per each search. FIG. 8b demonstrates that the time required to carry out a pipelined procedure for four subsequent search operations require also four clock cycles—one clock cycle per each search. Therefore, the pipelined search results in a Search throughput $f_s^P$ performed at the full clock rate $f_c$.

$$f_s^P = f_c = \frac{1}{T} \qquad (17)$$

The Two-Step Search utilizes a single search block that includes $C^{2S}$ comparator stages, where $$C^{2S} = \text{Max}(M,N) \qquad (17)$$

M is the number of Key columns in the TDA and N is the number of Key rows.

Pipelined search requires $C^P$ comparator stages to implement the Search function, where $$C^P = M+N \qquad (19)$$

The Pipelined Search is twice as fast than the Two-Step Search, but, since (M+N)>Max(M,N), then $C^P$>$C^{2S}$, which implies that it requires additional hardware.

The Two-Step Search, as well as the Pipelined Search, requires accessing the leftmost column elements in the TDA (RAM) in a single step (i.e., in a single clock cycle). The RAM structure facilitates access to a single RAM word, or a single TDA row, in a single clock cycle. However, the first column Keys are located in N different RAM words. Therefore, the RAM first-column Keys cannot be concurrently accessed, because there is only one readout facility capable of reading a single word at a time.

Figure 9:
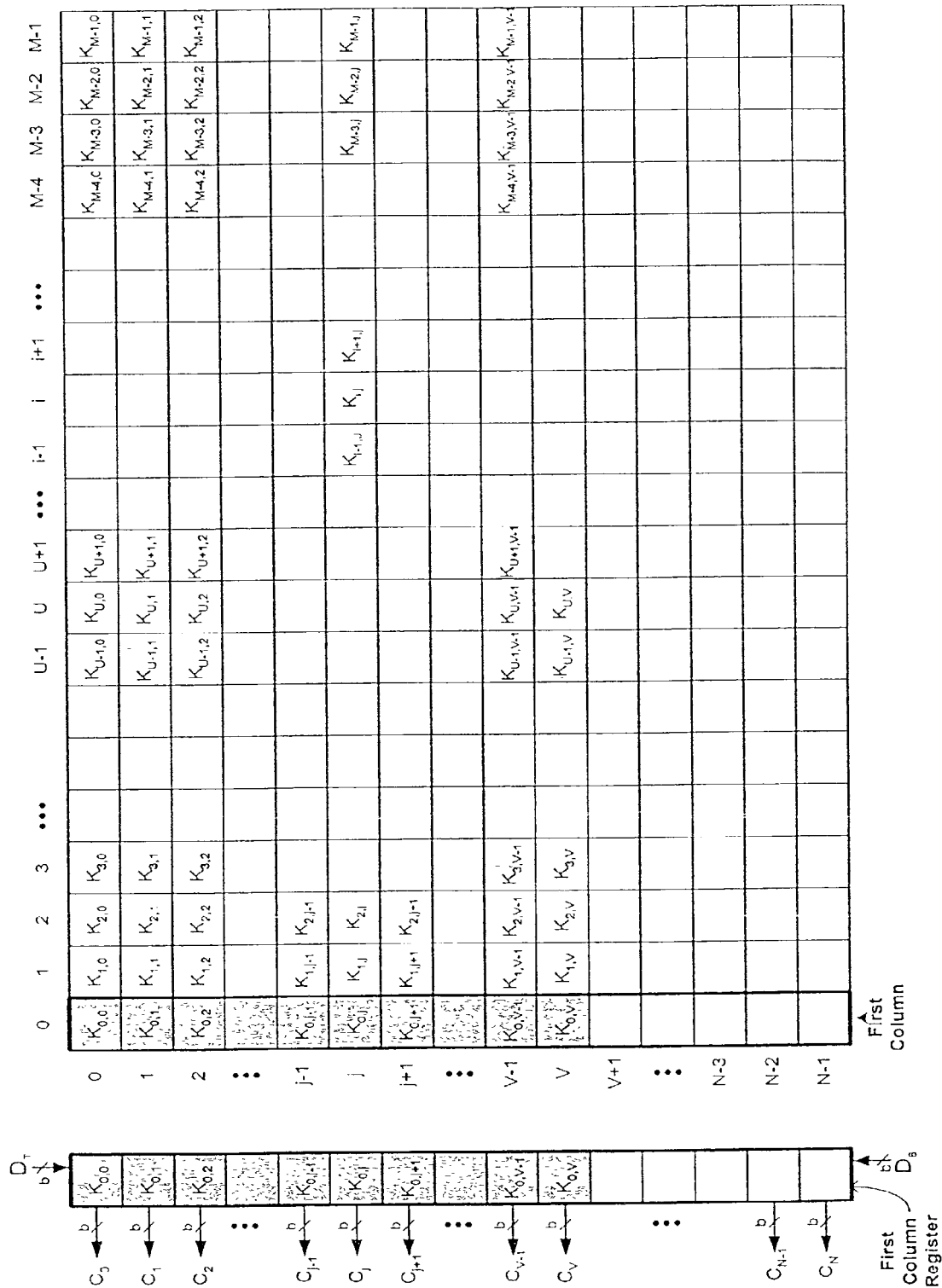
FIG. 9 schematically illustrates a First Column Register apparatus which enables a simultaneous access to the leftmost column Keys.

FIG. 9 illustrates a concurrent access to the leftmost column Keys according to a preferred embodiment of the invention. Access is performed by using a First Column Register 901 which is updated each time a Key is added or removed from the Key List, and incorporates the leftmost column Keys. Thus, in Step 1, access to the leftmost column keys of the TDA 900 is performed via the First Column Register 901, rather than to the TDA itself. The First Column Register facilitates parallel readout, enabling concurrent access to all First Column Keys.

The loading of the First Column Register Keys is performed during Key Enlist or Key Remove operations. During Enlist operation, the Keys are loaded from the $D_B$ input and serially shifted one position up. During Remove operation, the Keys are loaded from the $D_T$ input and serially shifted one position down. Therefore, the register 901 is implemented as a Serial-Input/Parallel-Output structure.

Figure 10:
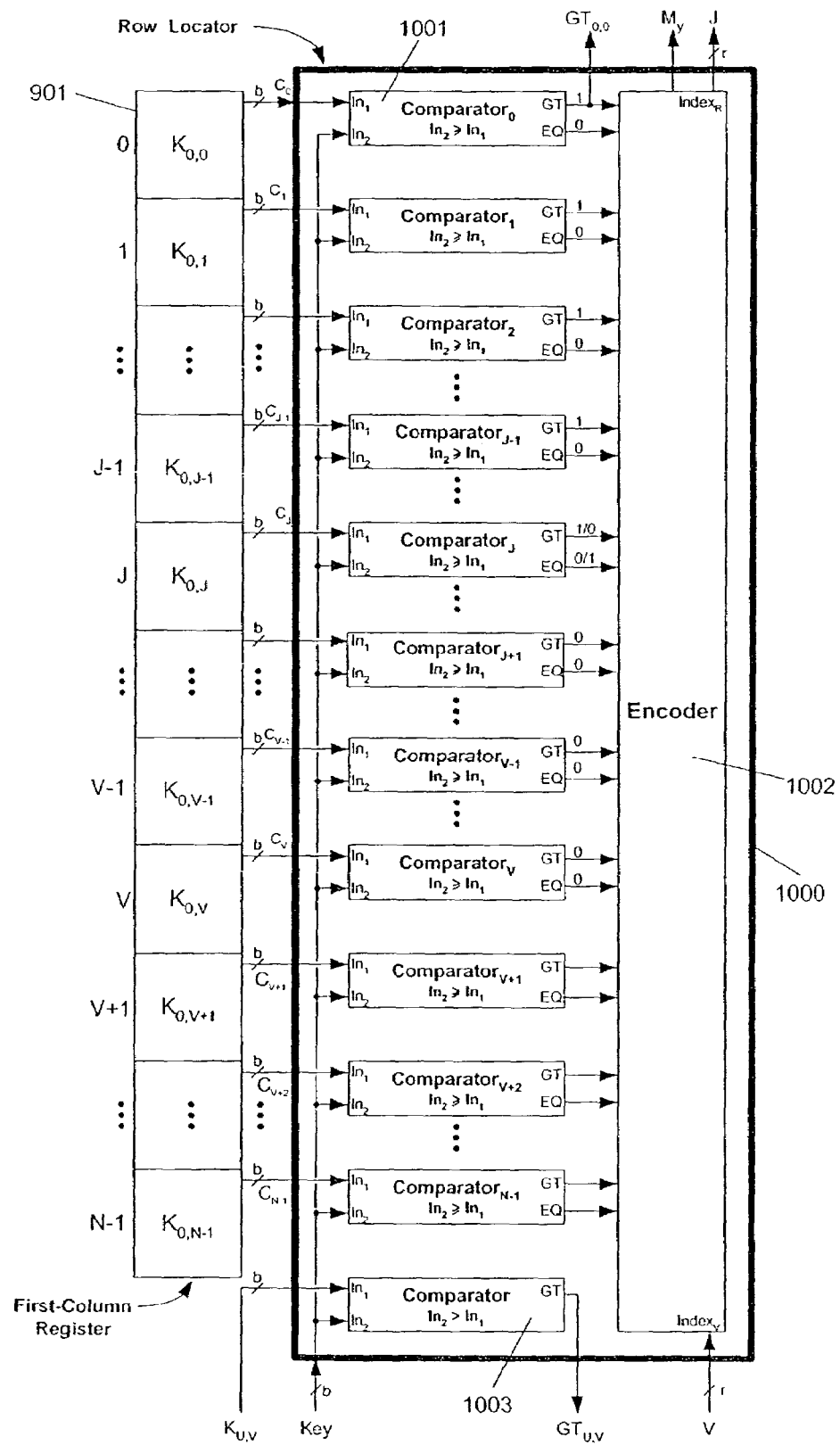
FIG. 10 illustrates a circuitry for locating the target row in which the searched key may be potentially located.

FIG. 10 schematically illustrates a circuitry for locating the target row according to a preferred embodiment of the invention. The Data (leftmost column Keys) stored in the First Column Register 901 is input into the Row Locator 1000. The Row Locator locates the row number in which the searched Key may potentially reside.

The inputs to the Row Locator are:

$C_0, C_1, C_2, \ldots, C_{J-1}, C_J, \ldots C_{V-1}, C_V, \ldots C_{N-2}, C_{N-1}$: These are b-bit First Column Register words which correspond to the TDA First Column Keys, $K_{0,0}, K_{0,1}, K_{0,2}, \ldots K_{0,J-1}, K_{0,J}, \ldots K_{0,N-2}, K_{0,N-1}$. Key is the searched b-bit value; $K_{U,V}$ is the highest listed Key integer.

$Index_V$ is an r-bit input to the row locator that denotes the last row that contains valid keys. This signal causes the locator to ignore all the First Column inputs $C_{V+1}, \ldots, C_{N-2}, C_{N-1}$; r is an integer determined by:

$$N \leq 2^r < 2 \cdot N \quad (20)$$

The Row Locator outputs are:

$Index_R$ is an r-bit output bus that indicates the index J of the row in which the Key may be potentially found.

$M_y$ is a signal that indicates whether a matching row has been found. A match indicates that one of the first column Keys exactly matches the searched Key.

$GT_{0,0}$ indicates that the Key value that is greater than $K_{0,0}$.
$GT_{U,V}$ indicates that the Key value is greater than $K_{U,V}$.

Table 1 lists all the combinations that the $Index_R$, $M_y$, $GT_{0,0}$, and the $GT_{U,V}$ outputs may assume, as well as their interpretation.

TABLE 1

| $Index_R$ | $M_y$ | $GT_{0,0}$ | $GT_{U,V}$ | Interpretation |
|---|---|---|---|---|
| $Index_R = 0$ | "0" | "0" | "0" | The searched Key value is below the $K_{0,0}$ value, and therefore the Key is not listed |
| $0 \leq Index_R \leq V$ | "0" | "1" | "0" | The number J as indicated by the $Index_R$ is the potential key-location-row to be searched. |
| $0 \leq Index_R \leq V$ | "1" | "0" | "0" | $K_{0,J}$ is the searched Key, where J is the potential key-location-row number indicated by $Index_R$ |
| $Index_R = V$ | "0" | "1" | "1" | The searched Key value is above the $K_{U,V}$ value, and therefore the Key is not listed. |

The Row Locator 1000 consists of a set of N comparators 1001, each of which compares the Key with one element enlisted in the First Column, and an Encoder 1002.

Each comparator outputs two signals:

GT: This signal is "True" when $In_2 > In_1$, otherwise the signal is "False".

EQ: This signal is "True" when $In_2 = In_1$, otherwise the signal is "False".

The main function of the encoder 1002 is to issue the $Index_R$ value:

$Index_R = J$, where J is given by the conditions of Eq. 13. (20)

The Encoder 1002 uses the input value V on $Index_V$ to account for all the comparator outputs, for all the comparators connected to $C_0, C_1, \ldots C_V$, and ignores all those that are connected to $C_{V+1}$ and above.

The Encoder also outputs the $M_y$="True" for Key=$K_{0,J}$; otherwise $M_y$="False".

The function which implements $GT_{U,V}$ is an additional comparator 1003, which compares the Key with $K_{U,V}$. If Key>$K_{U,V}$, then $GT_{U,V}$ signal is "True"; otherwise $GT_{U,V}$ is "False".

Figure 11:
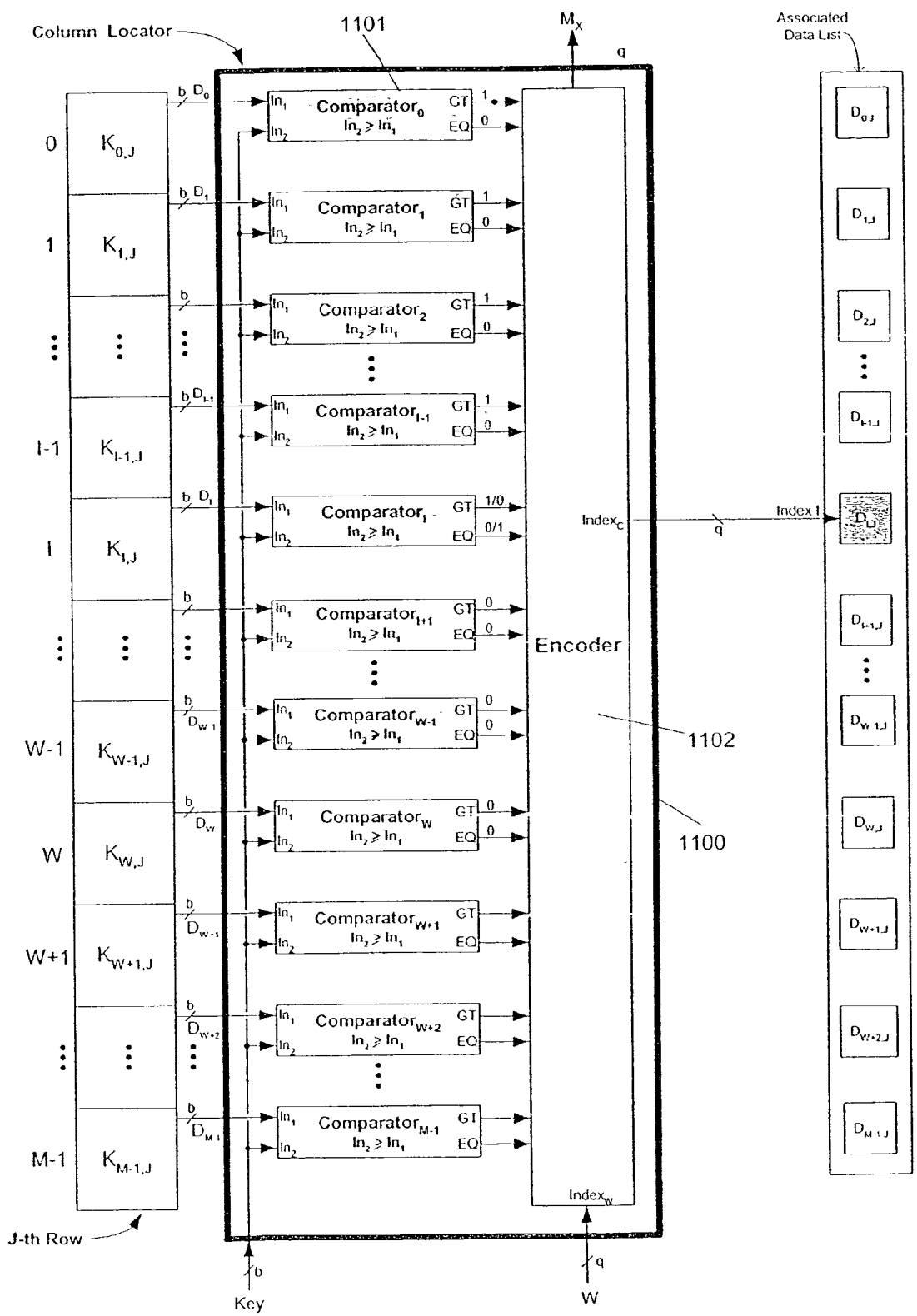
FIG. 11 schematically illustrates a circuitry for locating the key in the located row that matches the searched key.

After finding the row in which the searched Key may potentially reside, it is read out. FIG. 11 schematically illustrates a circuitry for locating the column that corresponds to the searched key in the target row, according to a preferred embodiment of the invention. The Column Locator 1100 identifies the searched Key column in the previously identified row.

The Column Locator outputs are:

$Index_C$: is a q-bit bus, which indicates, in a binary code, the index I of the column where the searched Key may be found. The $Index_C$ a signal is validated by the $M_x$ signal and must fulfill:

$$M \leq 2^q < 2 \cdot M \quad (21)$$

$M_x$: Column Match. When "True", this signal indicates that there is a Key Match and that the $Index_C$ output is valid. Otherwise, there is no match and the column index is invalid.

The Column Locator inputs are:

$D_0, D_1, D_2, \ldots, D_{I-1}, D_I, D_{I+1}, \ldots, D_{W-1}, D_W, D_{W+1}, \ldots D_{M-2}, D_{M-1}$: These inputs are M b-bit words output from the RAM word J. $D_i$ is related to the stored Keys in row J as follows:

$$D_i = K_{1,J} \text{ for } 0 \leq i \leq M-1 \text{ and } J \neq V, \text{ or} \quad (22)$$

$$D_i = K_{i,V} \text{ for } 0 \leq i \leq U \text{ and } J = V$$

$Index_W$: is a q-bit input bus that indicates the number of valid words in the row, since the row may not be filled entirely with valid Keys. If $Index_W = W$ then only the inputs $D_0, D_1, D_2, \ldots, D_{I-1}, D_I, D_{I+1}, \ldots, D_{W-1}$ are accounted for. W may assume one of two possible values:

$$W = M \text{ for } J \neq V \text{ and } W = U \text{ for } J = V \quad (23)$$

The Column Locator 1100 depicted in FIG. 11 consists of Comparator blocks 1101, each of which compares one of the $D_i$ inputs with the searched Key for any $i \leq W$. Since only a single input—$D_1$, may be equal to the Key, only the EQ (equal) output of this comparator is "True". The EQ outputs of all the other comparators are "False". In the case of no-match, none of the EQ outputs is "True". The Encoder 1102 connected to the comparators outputs generates the $Index_C$ and $M_x$ signals. If none of the Encoder inputs is "True", then $M_x$="False". If the I-th input is "True", then, $M_x$="True" and $Index_C = I$.

The Column Locator 1100 is simpler than the Row Locator 1000 due to the fact that this locator looks for an exact Key match whereas the Row Locator searches for a Key within a Key-Range. The Enlist operation (described herein below) requires a Range Search rather than an Exact Search.

The basic Search concept described hereinabove requires keeping the Key List in order. Since the Key List changes as Keys are added or removed, it must be updated from time to time. Using a conventional way to update Keys by applying a serial update process is lengthy. This requires a sequential readout and repositioning of the Key List entries. The time required for enlisting and removing a Key using this conventional approach may be approximated by:

$$t_E \approx t_R \approx 2 \cdot [M \cdot (V-J) + U - I] \cdot T + t_S \quad (24)$$

wherein $t_E$ is the Enlist time, $t_R$ is the Remove time,
$t_S$ is the Search time for the Enlist or Remove operation,
J is the row index of the Key Enlist or Remove location,
I is the column index of the Key Enlist or Remove location,
V is the index of the Key List last row,
U is the column index of the last valid Key,
M is the number of Keys in a row,
T is the RAM clock cycle, as key repositioning requires a readout and a rewrite key operations for each key.

In the worst case, the new Key is Enlisted to or removed from the location (0,0). In this case, the maximum Enlist time $t_E^{max}$, or Remove time $t_R^{max}$, are approximated by:

$$t_E^{max} \cong t_R^{max} \cong 2 \cdot [M \cdot (V-1)+U] \cdot T + t_S \quad (25)$$

For many applications, this method, which results in Enlist and Remove operations proportional to the number of the enlisted entries in the worst case, is too lengthy in time. The fact that the TDA structure is implemented with a w-bit RAM that incorporates M key words, can be utilized to shorten the time required for Enlist and Remove operations. Since each RAM word incorporates M Keys, then M Keys of the Key List can be readout and written at a time.

The position into/from which the Key has to be added/ deleted, should be located prior to any Key Enlist/Remove operation. The first step in adding a Key $K_E$ to an existing list is to find the location in which the new Key should be inserted. This search is then followed by the actual insertion.

Locating the Position Index of the New Enlisted Key:

Since all the enlisted Keys are different from each other, then the following possibilities may arise:

Case 1: The TDA is Empty
In this case, the Enlist operation is performed at the beginning of the list.

Case 2: $K_E < K_{0,0}$
In this case, the new Key should be inserted at the beginning of the list. All the other list entries have to be shifted by one position forward.

Case 3: $K_E > K_{U,V}$
In this case, the new Key is simply appended at the end of the list.

Case 4: $K_{M-1,J-1} < K_E < K_{0,J}$, $1 \leq J \leq V$
In this case, the Key should be inserted in the beginning of row J.

Case 5: $K_{i-1,J} < K_E < K_{i,J}$, $0 < i \leq M-1$
In this case, the Key has to be inserted in an internal position in the row. Then, the Search operation to locate the position where the Key should be inserted is slightly different from a key-search operation. Similarly to a Column Search, the Range that includes the Key value must be identified. All the Keys smaller than the new Key do not change their positions, but all the Keys that greater than the new Key should be shifted one position forward.

Figure 12:
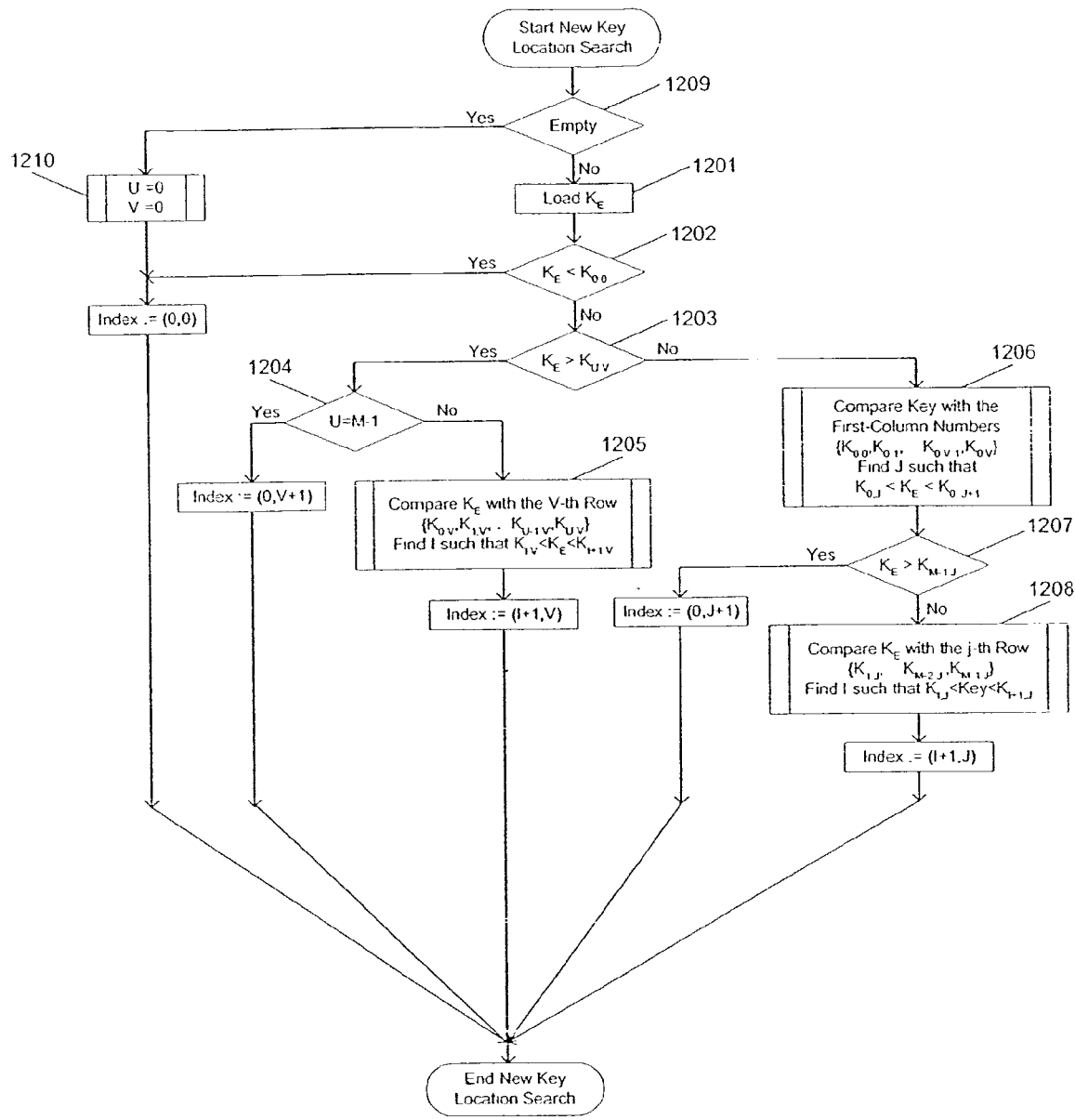
FIG. 12 shows a flowchart which describes the Search operation preceding the Key-Enlist operation.

FIG. 12 is a flowchart of the operations required for the Pre-Enlist Search, according to a preferred embodiment of the invention. This search produces a location index (I,J) pointing where the new Key should be inserted. In the first step 1209, the TDA is checked for emptiness. If found empty, then U=0 and V=0, as indicated in step 1210. Then, the location index (I,J) is set to (0,0). If the TDA is occupied, then the Search for the $K_E$ insertion location starts by loading $K_E$ in step 1201. In the next step 1202, the key $K_E$ is compared with $K_{0,0}$. If $K_E < K_{0,0}$ then the location index is (0,0). If $K_E \geq K_{0,0}$, then, in step 1203, $K_E$ is compared with $K_{U,V}$. If $K_E > K_{U,V}$, then, in step 1204 U is compared with M−1. If U=M−1, then the Enlist location index is (0,V+1). If U<M−1, then the location index is (U+1,V). If $K_E \leq K_{U,V}$, then, in step 1206, $K_E$ is compared with the first column entries to find the row index J for which $K_{0,J} < K_E < K_{0,J+}$. In the next step 1207, $K_E$ is compared with $K_{M-1,J}$. If $K_E > K_{M-1,J}$, then the location index is (0,J+1). If $K_E < K_{M-1,J}$, then $K_E$ is compared in step 1208 with the J-th row entries to find the column index I for which $K_{I,J} < Key < K_{I+1,J}$. If the Key is located, then the location index for Key Insertion is (I+1,J).

The Column Locator 110 of FIG. 11 is suitable for Search purposes only. The requirements for Enlist Row Location are similar to those for Column Location. Thus, the Column Locator is very similar to the Row Locator 1000 of FIG. 10 above, and is not illustrated for the sake of brevity.

Locating the Position Index of the Key to be Removed:

Since the searched Key and the Key to be Removed are already enlisted, the Pre-Remove Search operation is identical to a Key Search operation described hereinabove in FIG. 7.

Figure 13:
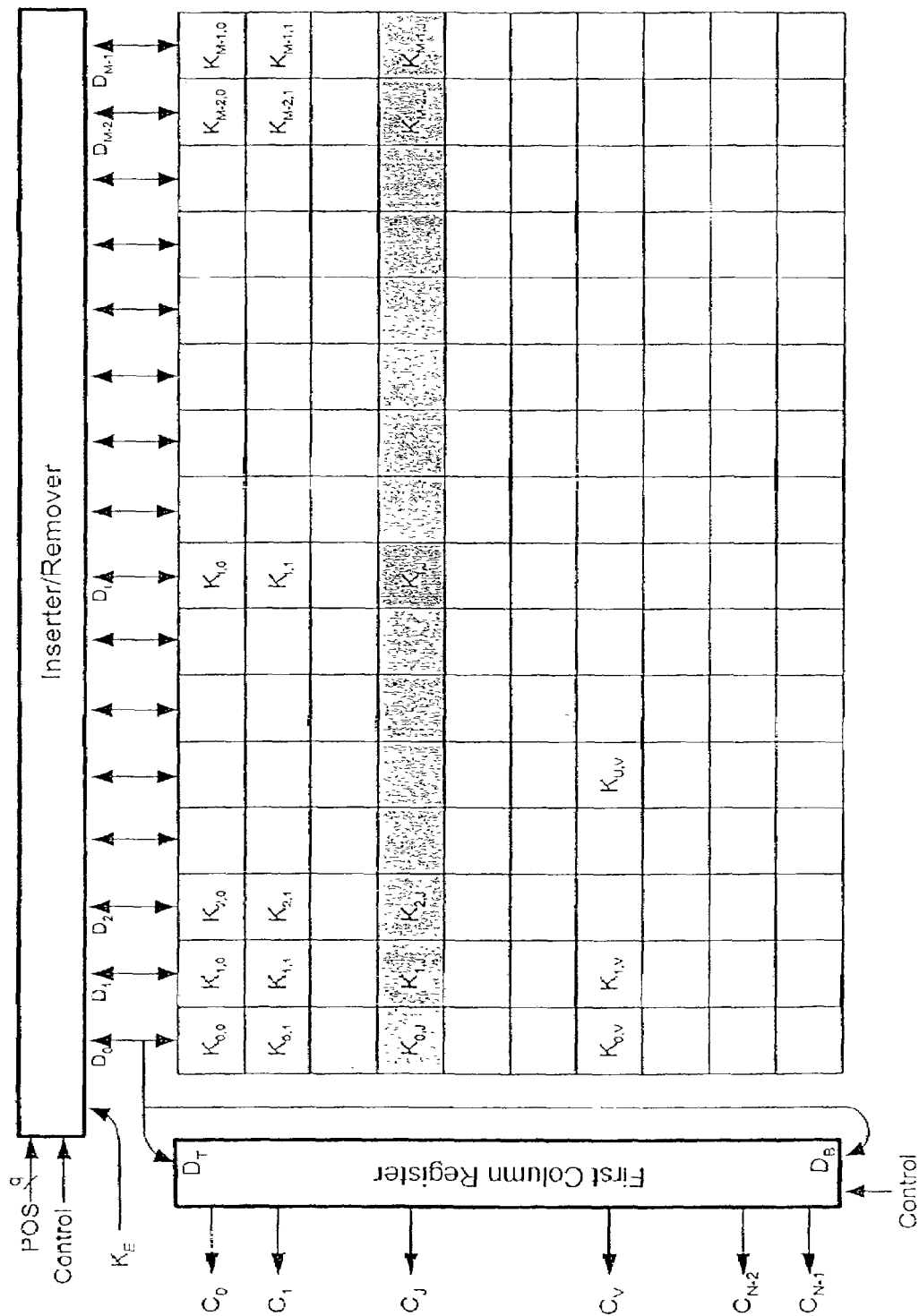
FIG. 13 illustrates the hardware requirements for enlisting and removal of keys in the Key-List TDA.

FIG. 13, illustrates the hardware components required for Key enlisting and removal in the TDA, according to a preferred embodiment of the invention. The hardware includes an Inserter/Remover 131, which operates on the TDA rows. The basic functions of the Inserter/Remover 131 are:

Insertion of a New Key in the appropriate row and column, as required for Enlist operation;

Repositioning of Key-List TDA elements as necessary for Enlist and Remove operations;

Source for the First Column Keys.

The First Column Register 901, described hereinabove in relation to FIG. 9, is deployed as a serial input, Shift-Up/Down Register. After the completion of an Enlist or a Remove operation, its contents are the mirror image of the TDA First Column contents.

Inserter/Remover Structure and Operations

Figure 14:
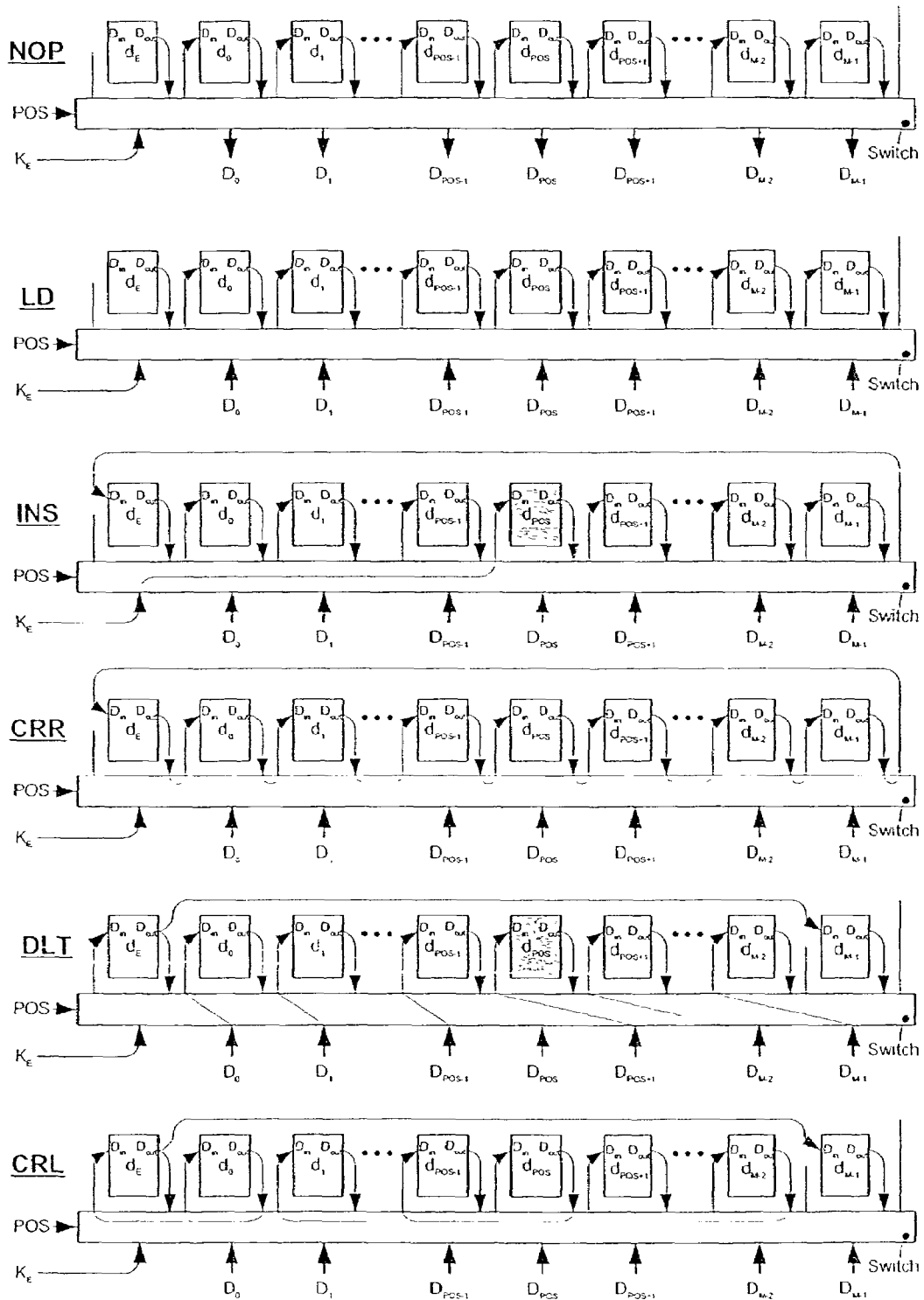
FIG. 14 shows the Inserter/Remover hardware required to carry out basic steps in the Enlist/Remove operations.

The Inserter/Remover, as detailed in FIG. 14, consists of M+1 b-bit registers. Registers $d_0, d_1, d_2, \ldots, d_{M-2}, d_{M-1}$, and register $d_E$ store data temporarily, and are used to reposition the Keys, as will be described hereinbelow. The interconnections between the registers are controlled by switching hardware. This hardware reconfigures the interconnections to one of the following six configurations shown in FIG. 14.

NOP (No Operation): Used for Enlist and Remove operations. When the NOP control is issued, the outputs $D_{out}$ of registers $d_0, d_1, d_2, \ldots, d_{M-2}, d_{M-1}$ drive the TDA I/O ports $D_0, D_1, D_2, \ldots, D_{M-2}, D_{M-1}$, respectively. The edge register $d_E$ is left unconnected.

LD (Load): Used for Enlist and Remove operations. During LD, the inputs $D_{in}$ of registers $d_0, d_1, d_2, \ldots, d_{M-2}, d_{M-1}$ are driven by the TDA I/O ports $D_0, D_1, D_2, \ldots, D_{M-2}, D_{M-1}$, respectively. The edge register $d_E$ is left unconnected.

INS($K_E$,POS) (Insert): Used for Enlist operation. When INS is applied, the Inserter/Remover is configured to:

Load the new Key $K_E$ into position as defined by the POS bus of the dpos stage.

Load the $D_{POS}, D_{POS+1}, D_{M-2}, D_{M-1}$, into $d_{POS+1}, d_{POS+2}, \ldots d_{M-1}, d_E$ respectively.

Load $D_0, D_1, D_2, \ldots, D_{POS-2}, D_{POS-1}$, into $d_0, d_1, d_2, \ldots, d_{POS-2}, d_{POS-1}$, respectively.

As a result of this operation, all the Keys smaller than the inserted Key do not change their position, awhile all the Keys greater than the inserted Key are shifted one position forward. The rightmost Key loaded into $D_{M-1}$ is temporarily stored in the $d_E$ stage to be appended as the leftmost Key in the next row in sequence.

CRR (Circulate to the Right): Used for Enlist operation. This operation shifts in circle the positions of all the Keys. At the end of this operation, the contents of $d_E,d_0,d_1,d_2, \ldots ,d_{M-2}, d_{M-1}$, reside in $d_0,d_1,d_2, \ldots ,d_{M-2}, d_{M-1},d_E$ respectively. This operation is used to:

Insert the rightmost Key of the preceding $(j-1)^{th}$ row as the leftmost Key of this row $(j^{th})$.

Reposition the row Keys one position forward.

Store the rightmost Key in $d_E$ for operation in the succeeding $(j+1)^{th}$ row.

DLT(POS) (Delete): Used for Remove operation. When DLT is applied, the Inserter/Remover is configured to:

Load the $D_{POS+1}, \ldots ,D_{M-2},D_{M-1}$,into $d_{POS}, \ldots d_{M-3}, d_{M-2}$, respectively.

Load $D_0,D_1,D_2, \ldots ,D_{POS-2},D_{POS-1}$, into $d_0,d_1,d_2, \ldots ,d_{POS-2},d_{POS-1}$, respectively.

Load the $d_E$ output value, $D_{out}$, into $d_{M-1}$.

This result of this operation is that all the Keys that are smaller than the deleted Key do not change their position, while all the Keys greater than the deleted Key are shifted one position backwards. This effectively overwrites the value of the removed key. The leftmost Key stored during the previous operation in the $D_E$ stage is loaded into the rightmost position in the row from which the key is removed.

CRL (Circulate to the Left): Used for Remove operation. This operation shifts in circle the positions of all the Keys in the row. At the end of this operation, the contents of $d_0,d_1,d_2, \ldots ,d_{M-2},d_{M-1}, d_E$, reside in $d_E,d_0,d_1,d_2, \ldots ,d_{M-2},d_{M-1}$, respectively. This operation is use to:

Insert the leftmost Key of the succeeding $(j+1)^{th}$ row as the rightmost Key of this $(j^{th})$ row.

Reposition the row Keys one position backwards.

Store the leftmost Key in $d_E$ for operation in the preceding $(j-1)^{th}$ row.

The Inserter/Remover operations described herein above are applied during Enlist and Remove operations.

First Column Register Structure and Operations

Figure 15:
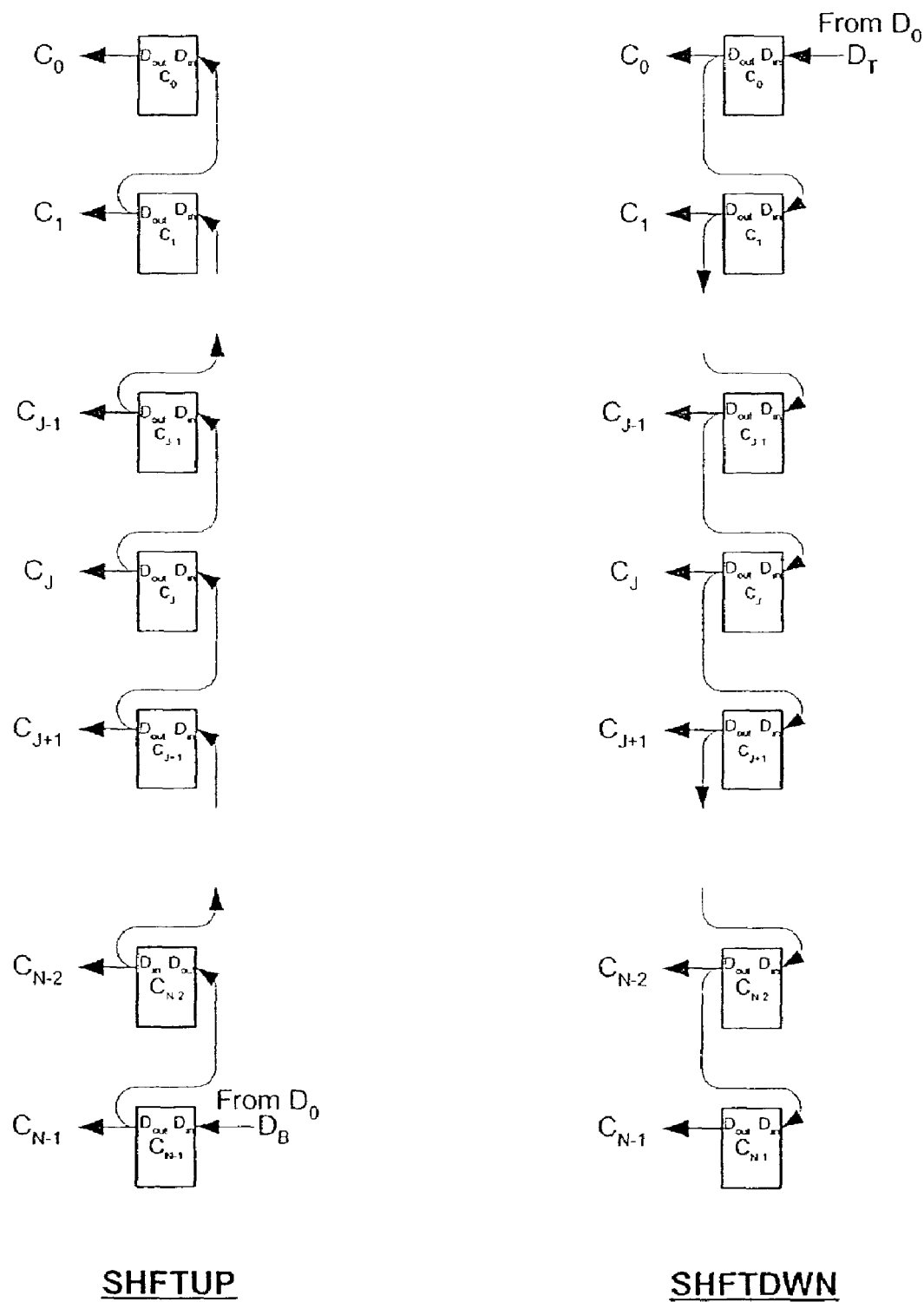
FIG. 15 illustrates the structure of a First Column Register of FIG. 13, and the basic steps used for Enlist and Remove operations.

FIG. 15 schematically illustrates the structure of a First Column Register of FIG. 13, used for Search, Enlist and Remove operations, according to a preferred embodiment of the invention.

The First Column Register, which is the mirror image of the First Column contents, consists of N, b-bit registers. The First Column Register performs two operations. It copies the new leftmost column value from the Inserter/Remover $D_0$ output when the processed row is written back into the TDA. The new value is either written to the $c_{N-1}$ or $c_0$ stage for Enlist and Remove operations, respectively, as shown in FIG. 15.

SHFTUP (Shift Up): Used for the Enlist operation. During this operation, $D_B$ serves as input and it copies $D_0$ into the $c_{N-1}$ register. After SHFTUP is performed, $c_{N-1},c_{N-2}, c_{N-3}, \ldots ,c_1$ are copied into $c_{N-2},c_{N-3}, \ldots c_1,c_0$, respectively, and the Key residing in $c_0$ is dumped.

SHFTDWN (Shift Down): Used for Remove operation. During this operation, $D_T$ serves as the input and it copies $D_0$ into the $c_0$ register. After SHFTDWN is performed, $c_0,c_1,c_2, \ldots c_{N-2}$ are copied into $c_1,c_2, \ldots c_{N-2}, c_{N-1}$, respectively, and the Key residing in $c_{N-1}$ is dumped.

Enlist Operation

Example: Enlisting "56" into a 5-Row by 8-Column TDA

Figure 16:
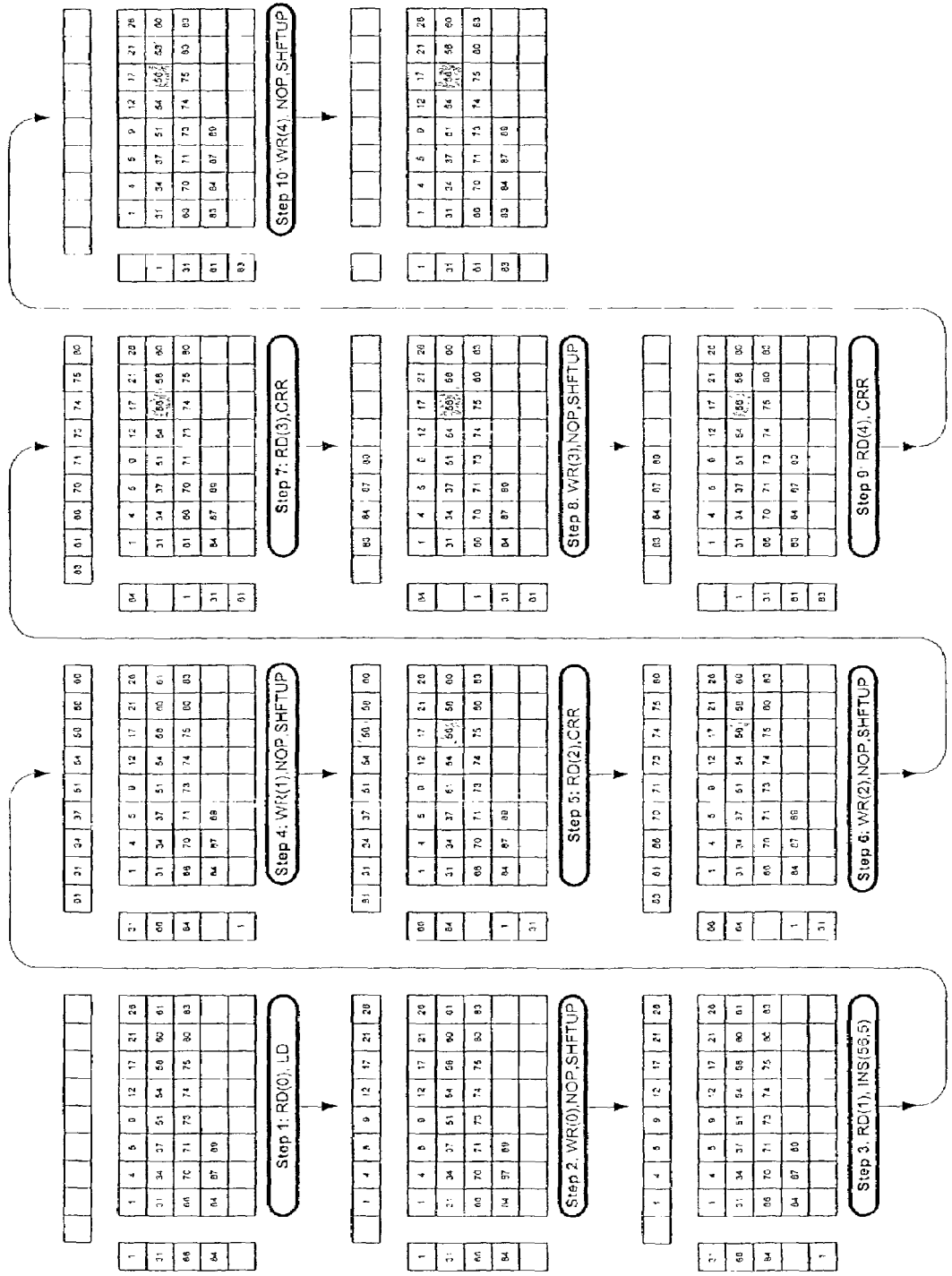
FIG. 16 illustrates an example of an Enlist operation of a key into a 5×8 Key-List TDA.

FIG. 16 schematically illustrates an example of an Enlist procedure of a key into a 5×8 TDA, according to a preferred embodiment of the invention. The states of the TDA, the First Column Register and the Inserter/Remover are shown after each step in the procedure.

The initial state of the TDA is depicted in the upper leftmost corner of FIG. 16. Each step consists of concurrent actions performed on a single TDA row, on the Inserter/Remover, and on the First Column Register.

Since the TDA is actually a RAM structure, the only two operations, which can be performed on the TDA, are:

RD(j): Read row number j.

WR(j): Write to row number j.

The Read and Write operations are performed from/to the Inserter/Remover.

In this example, the number "56" is enlisted into the Key-List TDA. The Enlist procedure starts with a Search operation to locate the position in which "56" has to be inserted. This position is in row number 1 and column number 5 (second row and sixth column).

The operation involves a series of steps using TDA readings followed by write operations, starting with row 0 and ending with row 4 (first and last rows, respectively).

The Inserter/Remover operations differ with respect to the location of the manipulated row:

For j<1, the readout rows (one row in this case) are simply loaded into the Inserter/Remover using the LD control.

For j=1, the insertion of the new Key 56 in column 5 involves INS(56,5) operation performed on the readout of row number 1.

For j>1, the rows readouts are accompanied by the Inserter/Remover CRR operation.

Each Write operation into the TDA row is accompanied by NOP (No Operation) in the Inserter/Remover and by SHFTUP in the First Column Register. This whites back the unmodified or modified row into the TDA and updates the First Column Register. The loading of the new First Column Key from the Inserter/Remover $D_0$ output updates the First Column Register.

In this example, the Enlist procedure takes 10 steps altogether, excluding the Pre-Enlist Search operation.

Generalized Enlist Operation

Figure 17:
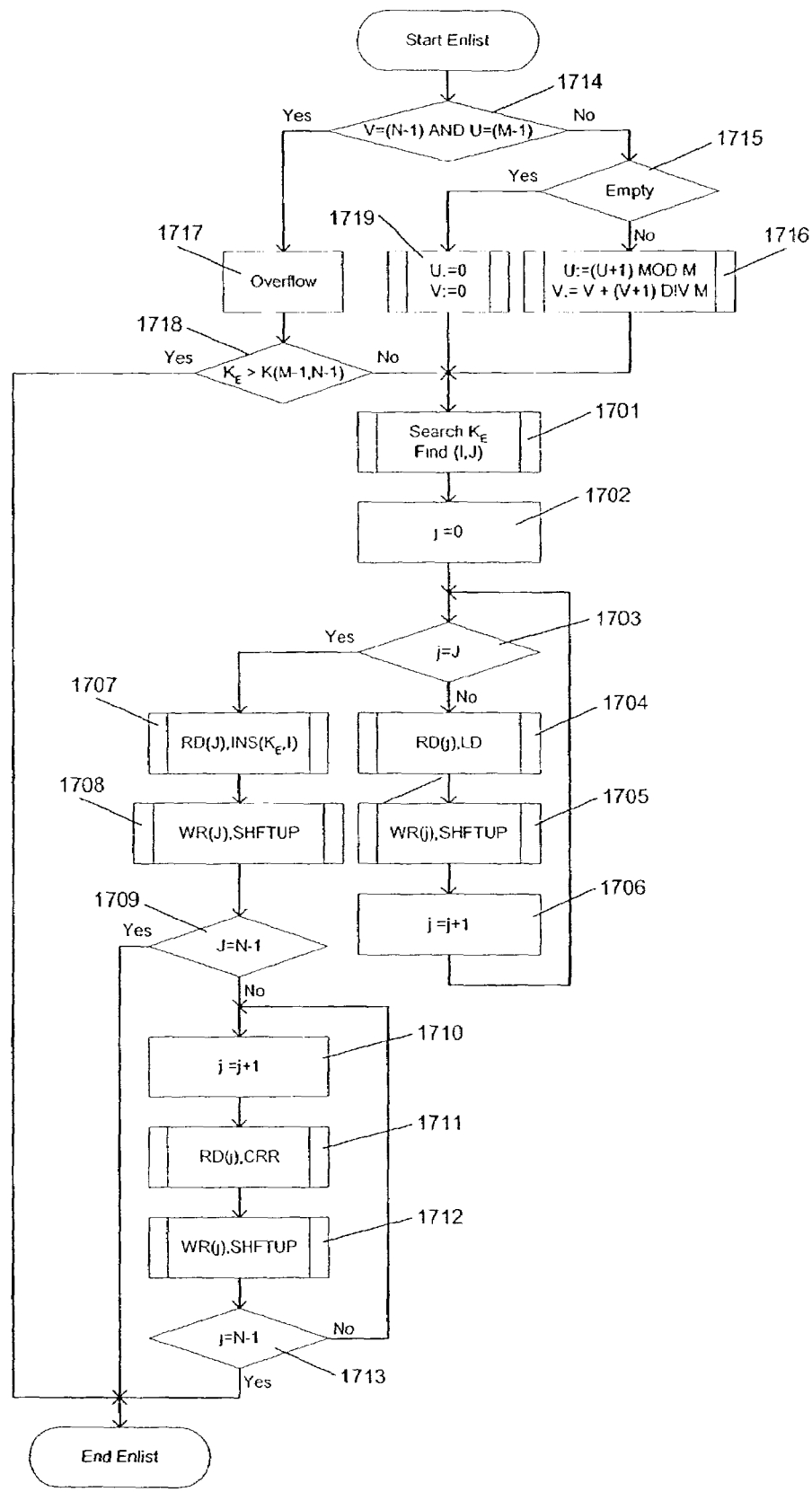
FIG. 17 shows a flowchart of an Enlist operation.

FIG. 17 shows a flowchart for the Enlist operation, according to a preferred embodiment of the invention. This procedure is based on the assumption that the Key to be inserted is not previously enlisted in the TDA. In the first step 1714, the TDA is checked to find out whether it has space for additional entries. If the TDA is Full, as indicated by V=N−1 and U=M−1, then the Overflow status is generated as indicated in step 1717. If $K_E$>K(M−1,N−1) in step 1718, there is no room for the new Key $K_E$ and the Enlist operation is terminated (without actual Enlisting). If, however, $K_E$<K(M−1,N−1), the new Key is enlisted, but K(M−1,N−1) is pushed out of the TDA. If the checkup in step 1714 indicates that there is room for a new entry in the TDA, the TDA is checked for Emptiness in step 1715. If found not Empty, the last entry location in the TDA is updated in step 1716. Then, a Pre-Enlist Search operation starts, in step 1701, in order to locate the position in which the new Key $K_E$ is to be enlisted. If the TDA is found Empty, U=0 and V=0 are set in step 1719, which is followed by step 1701 that starts the Pre-Enlist Search operation.

In step 1701, the indices (I,J) of the key which is subsequent to the new enlisted key $K_E$ is searched. In the next step

1702, the pointer is directed to the first row (j=0). In step 1703, the index j of the row to which the pointer is directed is compared with J. If j≠J (i.e., j<J, since the pointer is directed first to row 0), the row j is read and loaded into the Inserter/Remover in step 1704. In step 1705, row j is written back into the TDA while the content of each cell in the First Column Register is updated by shifting one position upwards and copying the key K(0,j) into the last cell $c_{N-1}$ of the First Column Register in each stage. In step 1706, the pointer is directed to the next row and steps 1703 to 1706 are repeated for each subsequent row, until the pointer is directed to row J. If j=J, in the next step 1707, the row J is read, loaded into the Inserter/Remover, and the new enlisted key $K_E$ is inserted into the cell that corresponds to column I, while shifting all the subsequent keys in row J one position forward (to the right) and storing the rightmost Key in row J in the leftmost cell of the Inserter/Remover. In step 1708, row J is written back into the TDA while the content of each cell in the First Column Register is updated by shifting it one position upwards and by copying the key K(0,J) into the last cell $c_{N-1}$ of the First Column Register. In step 1709, the index J of the row in which the new enlisted key $K_E$ is inserted is compared with N−1 (the last row index). If J=N−1 (i.e., row J is the last row) the Enlist operation is terminated. If j≠N−1, in step 1710, the pointer is directed to the next row. In step 1711, the next row (starting from row J+1) is read and loaded into the Inserter/Remover and all Keys in the Inserter/Remover are shifted one position forward (to the right). In step 1712, the next row j is written back into the TDA while the contents of the First Column Register cells are updated by shifting the cell entries one position upwards and copying the key K(0,j) into the last cell $c_{N-1}$ of the First Column Register. In step 1713, the index j of the next row is compared with N−1 (the index of the last row). If j=N−1 (i.e., row j is the last row), the Enlist operation is terminated. If j≠N−1, steps 1710 to 1712 are repeated until the last row is reached.

The Enlist execution time $t_E$ can be approximated by:

$$t_E \approx 2 \cdot (N+1) \cdot T + t_S \quad (26)$$

N is the number of TDA rows;
T is the memory clock period;
$t_S$ is the search time.

$t_E$ is significantly shorter in comparison to the time required for Enlist and the approach described by Eq. 25 above.

In the Enlist process described hereinabove, dummy read/write operations are performed front/to the unmodified TDA rows. Alternatively, a process that scans only the rows to be modified and skips the unmodified rows may be used. This can be done by starting with the row in which the new Key $K_E$ is inserted. This approach typically results in a shorter Enlist time, but not necessarily in a shorter worst-case Enlist time.

Remove Operation

Example: Removing "58" from a 5-Row by 8-Column TDA

Figure 18:
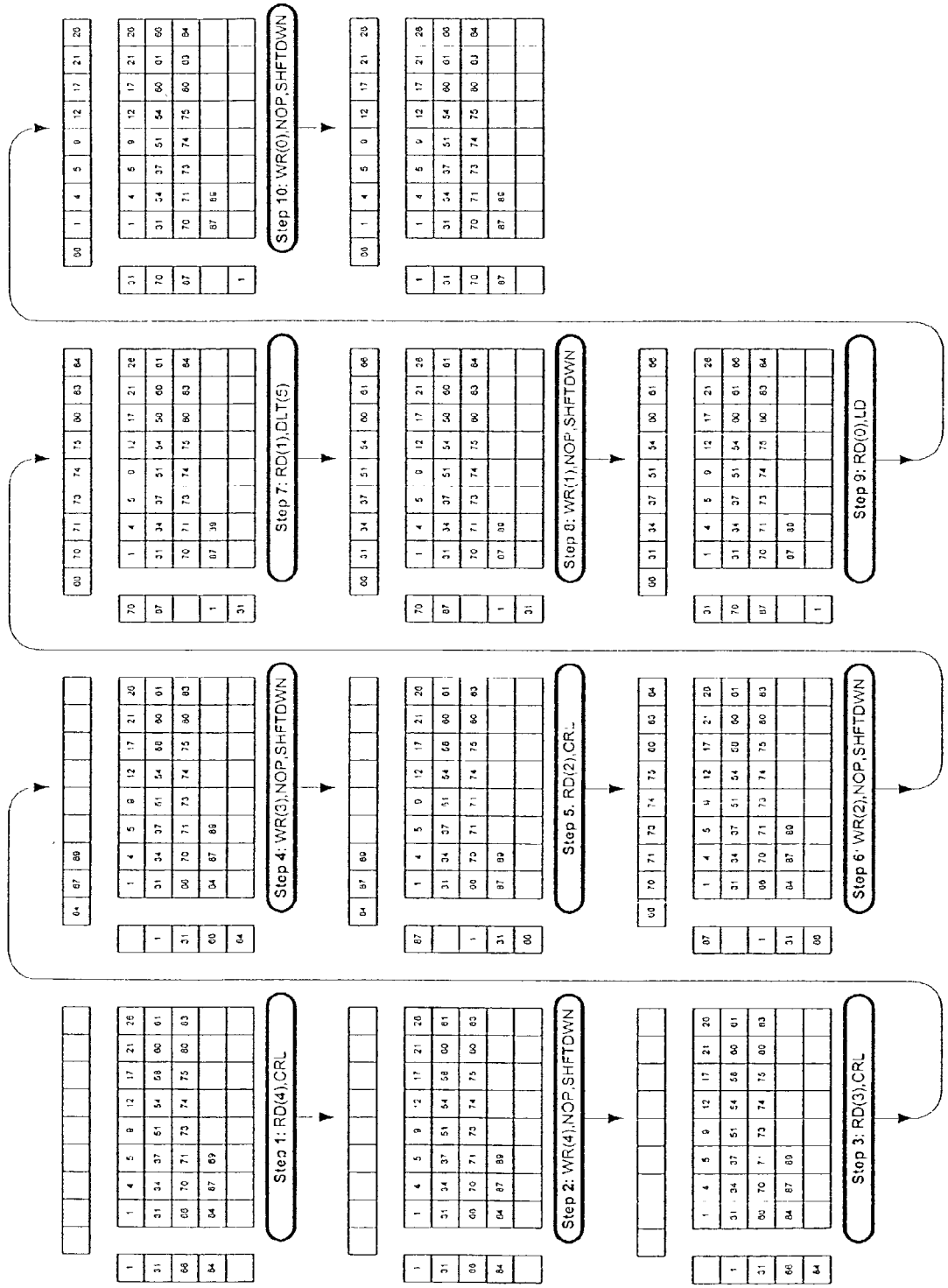
FIG. 18 illustrates an example of a Remove operation of a key from a 5×8 Key-List TDA.

FIG. 18 schematically illustrates an example of a Remove procedure of a key from a 5×8 Key-List TDA, according to a preferred embodiment of the invention. The state of the TDA, the First Column Register, and the Inserter/Remover is shown after each step in the Remove procedure.

The initial state of the TDA is shown in the upper leftmost corner of FIG. 18. Similarly to the Enlist procedure, each step consists of a concurrent Read or Write operations performed on a single row of the TDA, an Inserter/Remover, and a First Column Register.

In this example, the number "58" is to be removed from the TDA. The Remove operation starts with a Search operation to locate the position of Key 58. This position is in row number 1 and column number 5 (second row and sixth column).

The operation involves a series of steps employing TDA readings followed by Write operations, starting with the last row (row 4), going backwards and ending with the first row (row 0).

The Inserter/Remover operations with respect to the location of the manipulated row are described herein below.

For 1<j≦N−1, each row readout is accompanied by the Inserter/Remover CRL control. This operation shifts all the Keys by one position to the left and saves the leftmost Key to be inserted in the rightmost position (M−1) of the preceding index row (next in sequence).

For j=1, the deletion of the Key 58 involves DLT(58) operation in row number 1.

For j<1, the rows readouts are accompanied by the Inserter/Remover LD operation. This control leaves these rows unmodified.

The Write operation into the TDA is accompanied by NOP (No Operation) in the Inserter/Remover, and by SHFT-DWN in the First Column Register. This operation writes back the modified or unmodified row into the TDA, and involves updating the First Column Register, which copies the new First Column Keys from the Inserter/Remover $D_0$ output.

In this example, the Remove operation requires 10 steps altogether, excluding the Pre-Enlist Remove Search operation.

Generalized Remove Operation

Figure 19:
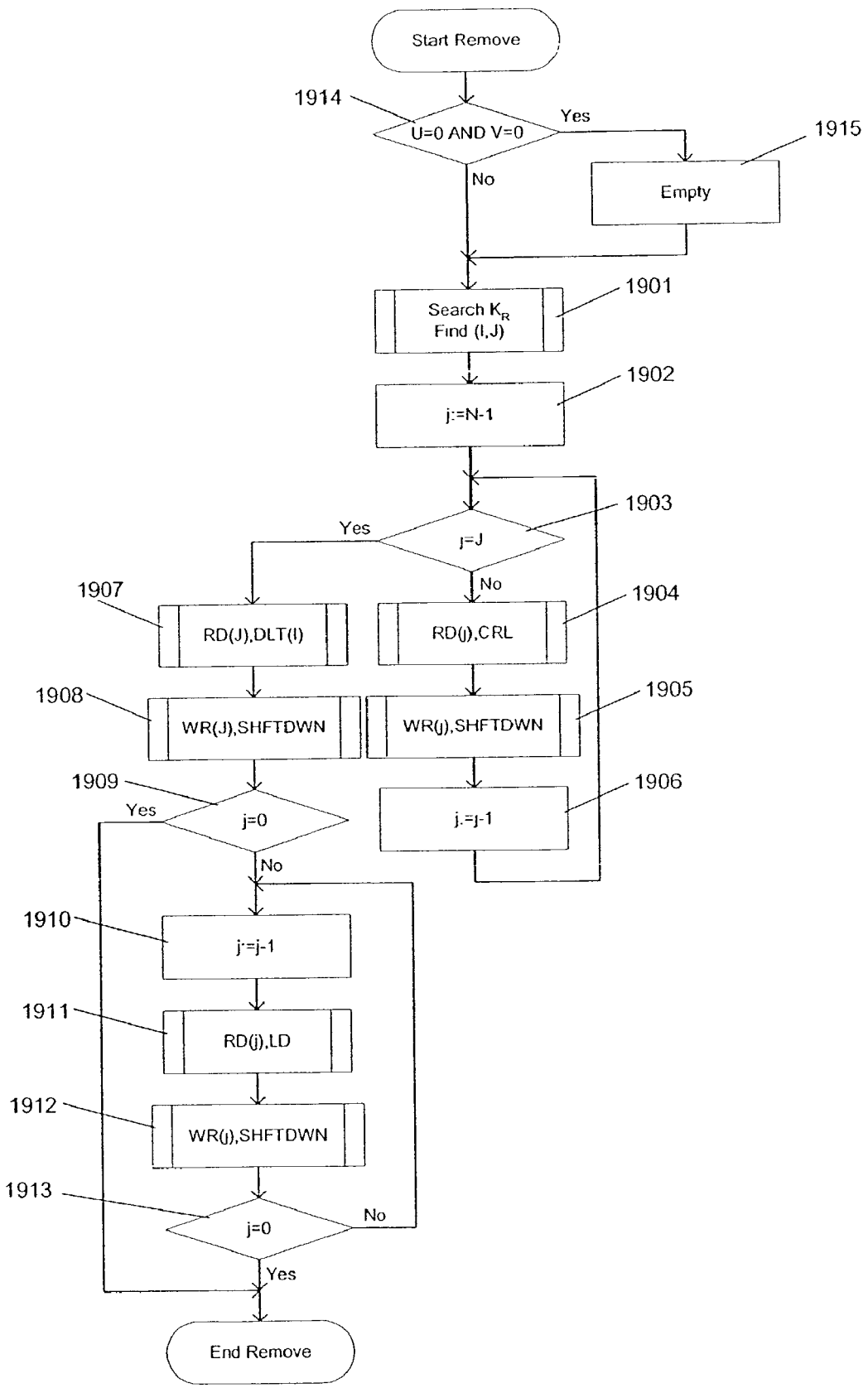
FIG. 19 shows a flowchart of a Remove operation.

FIG. 19 shows the Remove operation flowchart, according to a preferred embodiment of the invention. This procedure is based on the assumption that the Key to be removed is enlisted in the TDA. In the first step 1914, the TDA is checked to find out whether it contains only one entry (U=0 and V=0). If there is only a single entry enlisted, the Empty state is set in step 1915 to indicate that following the Remove operation the TDA will be Empty. Step 1901 follows either after step 1914, if prior to the removal the TDA enlists more than one entry, or after step 1915. In step 1901, the index-pair (I,J) of the key $K_R$ to be removed is identified. In step 1902, the pointer is directed to the last row (j=N−1). In step 1903, the present row index j is compared with J. If j≠J (i.e., J<j≦N−1, since the pointer is directed first to row N−1), in the next step 1904 the row j is read, loaded into the Inserter/Remover, and all its Keys are shifted one position backwards (to the left). In step 1905, row j is written back into the TDA while the content of each cell in the First Column Register is updated by shifting it one position down and copying the key K(0,j) into the cell $c_0$ of the First Column Register. In the next step 1906, the pointer is directed to the preceding row j−1, and steps 1903 to 1906 are repeated for each subsequently preceding row, until the pointer is directed to row J. If j=J, in step 1907, the row J is read, loaded into the Inserter/Remover, and all the keys higher than the key to be removed (in column I) are shifted one position backwards (to the left); the leftmost key of the previously manipulated (j+1)$^{th}$ row is stored in the rightmost register $d_{M-1}$ of the Inserter/Remover. This is carried out by executing the DLT(POS) operation. In step 1908, the modified row J is written back from the Inserter/Remover into the TDA while the content of each cell in the First Column Register is updated by shifting it one position down and copying the key K(0,J) into the cell $c_0$ in the First Column Register. In step 1909, the current row index j is compared with zero (index of the first row). If j≠0, in the next step 1910, the pointer is directed to the preceding row. In step 1911, the preceding row is read and loaded into the Inserter/Remover. In step 1912, the preceding row is written back into the TDA while the content of each cell in the First Column Register is updated by shifting it one position downwards and copying the key K(0,j) into the cell $c_0$ of the First Column Register. In the next step 1913, the index j of the preceding row is compared with zero (index of the first row). If j=0 (i.e., row j is the first row) the Remove operation is terminated. Otherwise, if j≠0, steps 1910 to 1912 are repeated until the first row is reached.

The Remove operation is completed in time $t_R$, which can be approximated by:

$$t_R \cong 2 \cdot (N+1) \cdot T + t_S \qquad (27)$$

and is significantly shorter in comparison to the time required for Remove operation as described by Eq. 25 above.

Enlist and Remove Operations in Associated-Data TDA

According to a preferred embodiment of the invention, the Key in the Key-List TDA and its Associated Data in the Associated-Data TDA have an identical index-pair (i,j). Therefore, the Enlist and Remove operations performed on Key-List TDA must be accompanied by a corresponding, simultaneous and identical Enlist and Remove operations on the Associated-Data TDA. These corresponding Enlist and Remove operations are not described for the sake of brevity.

Present Invention Advantages

The method described in the present invention allows to reduce the number of required comparators using the RAM-based TDA (compared to conventional CAM implementation) up to a fraction $F_c$ defined as:

$$Fc \equiv \frac{\#\_of\_comparators\_used}{\#\_of\_comparators\_used\_in\_a\_conventional\_CAM} \qquad (28)$$

$F_c$ can be approximated by:

$$Fc \cong \frac{1}{N} + \frac{1}{M} \qquad (29)$$

wherein,

N is the number of TDA rows;

M is the number of TDA columns.

For example, a number of 1024 entries (cells) arranged as a 32×32 TDA in a RAM-based CAM is only 6.25% of the number of comparators required for a conventional CAM implementation. Furthermore, the RAM-Based CAM described in the present invention can use a state-of-the-art RAM technology that allows additional density benefits. The density achieved using the present invention is estimated to be larger by a factor of 4 to 8 in comparison with a CAM using the same SRAM technology, or even better for a DRAM-based CAM.

In many applications, such as data communications, the CAM key lookup rate is by far the most important performance factor. For a pipelined Search, the CAM key lookup rate equals that of a conventional CAM in terms of number of clocks per single Search. However, optimizing the RAM structure results in a faster clock rate (determined by the fastest RAM that is currently available) and therefore in a higher key lookup rate.

Theoretically, a conventional CAM has a lower latency (time from the Key submission until its Associated Data is output) in terms of the number of steps. It takes two steps for the RAM-based CAM to complete a Search, compared to a single step for a conventional CAM. However, the RAM-based CAM can operate at a much faster clock rate, compensating for the greater number of steps.

Preferably, the RAM-based CAM can be implemented using a volatile SRAM, However, other volatile-memory technologies, such as DRAM or CCD can be also applied. Alternatively, the same architecture can be implemented with nonvolatile technologies, such as ROM, EPROM, $E^2$PROM, Flash-memory or magnetic-media.

As used herein in the specification and in the claims section that follows, the term "row" refers to a first line of cells in an array, and the term "column" refers to a second line of cells in an array, the second line of cells being disposed in perpendicular fashion to the first line of cells. For the sake of convenience, all rows are horizontal in the Figures provided herein, and all the columns are vertical.

As used herein in the specification and in the claims section that follows, the term "monotonic order" and the like refer to one or more rows in an array in which the key entries are arranged in ascending order or in descending order. The term "monotonic order" specifically includes rows having a cyclic monotonic order, e.g., 9,15,69,81,2,4,7, or 23,105, 222,611,8,14.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A computer-implemented method for arranging and storing data in a memory and for extracting the data from the memory in response to an input key, the method comprising the steps of:

(a) providing at least a first array having rows and columns, each row of said rows having a plurality of cells for storing a plurality of key entries;

(b) providing at least a second array having rows and columns, each row of said rows in said second array having a plurality of cells for storing a plurality of data entries, each of said data entries being associated with a particular one of said key entries;

(c) arranging said key entries in monotonic order;

and, if a particular stored key entry of said key entries is stored within said first array, (d) identifying, in response to the input key, a single row among said rows of said first array as a sole row that contains said particular stored key entry.

2. The method of claim 1, wherein said first array is disposed in a storage medium selected from the group consisting of: random access memory (RAM), static RAM (SRAM), dynamic RAM (DRAM), charge coupled device (CCD), read-only memory (ROM), erasable programmable ROM (EPROM), electrically erasable programmable ROM ($E^2PROM$), flash memory, and magnetic media.

3. The method of claim 1, further comprising the step of:
(e) subsequently to said identifying of step (d), identifying a single cell within said single row as a sole cell containing said particular stored key entry of said key entries.

4. The method according to claim 3, further comprising the step of:
(f) if said particular stored key entry matches the input key, retrieving a particular one of said data entries associated with said particular stored key entry.

5. The method of claim 1, further comprising the step of:
(e) identifying a single cell within said single row as a sole cell for enlisting a particular key entry.

6. The method of claim 1, wherein each of said data entries has a unique pair of row and column indices for association with a unique pair of row and column indices of a particular one of said key entries.

7. The method of claim 1, wherein said first array is completely filled with said key entries.

8. The method according to claim 1, wherein said identifying is performed using a plurality of comparators, and wherein a ratio (R) of a number of said plurality of comparators to a number of said cells for storing said plurality of key entries is less than one to one (1:1).

9. The method according to claim 8, wherein said ratio (R) is approximately defined by:

$$R=1/N+1/M$$

wherein:
N is a number of said rows within said first array, and
M is a number of said columns within said first array, said columns for storing a plurality of key entries.

10. The method according to claim 1, further comprising the step of:
(e) storing an end key entry from each said row of said rows of said first array in a Column Register.

11. The method of claim 10, wherein said identifying said single row is performed by:
(i) comparing each said end key entry and the input key to produce a result, and
(ii) identifying a row in which said result undergoes a change in inequality status.

12. The method of claim 13, further comprising the step of:
(f) selecting said row in which said result undergoes a change in inequality status.

13. The method of claim 1, wherein a rate of key lookups of said key entries is increased by concurrently:
i) identifying a location of an input key in a row in said first array that has been previously identified and selected, and
ii) identifying and selecting a row that may contain a subsequently submitted input key.

14. The method of claim 1, wherein said identifying in step (d) includes comparing a new key entry with a key entry disposed in an end column of said first array.

15. The method of claim 14, further comprising the step of:
(e) checking, prior to enlisting, that said new key entry is not already enlisted in said first array.

16. A device for storing arranged data in a memory, and for extracting the data therefrom, the device comprising:

(a) a memory including:
(i) a first array of cells having rows and columns, each of said rows having a plurality of cells for storing a plurality of key entries, each of said cells having a unique address and being accessible via an input key;
(ii) a second array of cells having rows and columns, each of said rows in said second array having a plurality of cells for storing a plurality of associated data entries;
wherein said memory is designed and configured such that each of said data entries is associated with a particular one of said key entries, and wherein said memory is selected from the group of memories consisting of: random access memory (RAM), static RAM (SRAM), dynamic RAM (DRAM), charge coupled device (CCD), read-only memory (ROM), erasable programmable ROM (EPROM), electrically erasable programmable ROM ($E^2PROM$), flash memory, and magnetic media, and (b) a processor for:
(i) arranging said key entries in monotonic order, and
(ii) identifying a single row among said rows of said first array as a sole row for performing a processing operation.

17. The device of claim 16, wherein each of said associated data entries has a unique pair of row and column indices for association with a unique pair of row and column indices of a particular one of said key entries.

18. The device of claim 16, wherein said processor includes:
i) a row locator containing at least a first comparator, for comparing contents of an end column of said first array with said input key.

19. The device of claim 18, wherein said processor further includes:
ii) a column locator containing at least a second comparator, for comparing contents of said sole row with said input key to identify a single cell within said sole row as a sole cell containing a matching key entry for said input key.

20. The device of claim 18, wherein said processor further includes:
ii) a column register for allowing a simultaneous access to said key entries disposed in said end column of said first array.

21. The device of claim 16, wherein said processor includes:
(i) an inserter/remover for rearranging data stored in said arrays.

22. The device of claim 21, wherein said inserter/remover includes shift registers.

23. The device of claim 21, wherein said inserter/remover includes a number of shift registers, said number exceeding by one, a number of said columns in said first array.

24. The device of claim 19, wherein said processing operation includes retrieving an associated data entry of said plurality of associated data entries, said data entry being associated with said particular stored key entry.

25. A device for storing arranged data in a memory, and for extracting the data therefrom, the device comprising:
(a) a memory including:
(i) a first array of cells having rows and columns, each of said rows having a plurality of cells for storing a plurality of key entries, each of said cells having a unique address and being accessible via an input key;

(ii) a second array of cells having rows and columns, each of said rows in said second array having a plurality of cells for storing a plurality of associated data entries;

wherein said memory is designed and configured such that each of said data entries is associated with a particular one of said key entries, and (b) a processor associated with a plurality of comparators, said processor for:

(i) arranging said key entries in monotonic order, and (ii) identifying, using said comparators, a single row among said rows of said first array as a sole row for performing a processing operation, wherein a ratio (R) of a number of said plurality of comparators to a number of said cells for storing said plurality of key entries is less than one to one (1:1).

26. The device of claim 25, wherein said ratio (R) is approximately defined by:

$R = 1/N + 1/M$ wherein:
N is a number of said rows within said first array, and
M is a number of said columns within said first array, said columns for storing a plurality of key entries.

27. The device of claim 25, wherein the device further comprises:

(c) a column register for allowing a simultaneous access to a plurality of said key entries disposed in a column of said columns of said first array.

28. The device of claim 27, wherein said column is an end column.

29. The device of claim 27, wherein said column register contains values of said key entries disposed in said column.

30. The device of claim 27, wherein comparators of said comparators are configured for comparing the input key with said values in said column register.

31. The device of claim 25, wherein each of said associated data entries has a unique pair of row and column indices for association with a unique pair of row and column indices of a particular one of said key entries.

32. The device of claim 25, wherein said monotonic order is a cyclic monotonic order.

* * * * *